US012700868B2

(12) United States Patent　　　　(10) Patent No.:　US 12,700,868 B2

Wu et al.　　　　　　　　　　　　　　(45) Date of Patent:　　Aug. 4, 2026

(54) DELAY BUFFER UNIT AND OPERATING METHOD THEREOF, COMPUTING DEVICE AND OPERATING METHOD THEREOF

(71) Applicant: TSINGHUA UNIVERSITY, Beijing (CN)

(72) Inventors: Huaqiang Wu, Beijing (CN); Songtao Wei, Beijing (CN); Sining Pan, Beijing (CN); Dong Wu, Beijing (CN); Peng Yao, Beijing (CN); Lu Jie, Beijing (CN); Bin Gao, Beijing (CN); He Qian, Beijing (CN)

(73) Assignee: TSINGHUA UNIVERSITY, Beijing (CN)

( * ) Notice: Subject to any disclaimer, the term of this patent is extended or adjusted under 35 U.S.C. 154(b) by 268 days.

(21) Appl. No.: 18/716,127

(22) PCT Filed: Nov. 16, 2023

(86) PCT No.: PCT/CN2023/132007

§ 371 (c)(1),
(2) Date: Jun. 3, 2024

(87) PCT Pub. No.: WO2024/131396

PCT Pub. Date: Jun. 27, 2024

(65) Prior Publication Data

US 2026/0172035 A1　　Jun. 18, 2026

(30) Foreign Application Priority Data

Dec. 23, 2022　　(CN) ......................... 202211668042.3

(51) Int. Cl.
G06F 7/523　　　(2006.01)
G11C 13/00　　　(2006.01)
(Continued)

(52) U.S. Cl.
CPC ............ H03L 7/0816 (2013.01); G11C 13/00 (2013.01); G06F 7/523 (2013.01);
(Continued)

(58) Field of Classification Search
CPC ..... G11C 13/00; G11C 13/0021; G06F 7/523; H03L 7/0816; H03K 5/133; H03K 5/134; H03K 17/28; H03K 17/284
(Continued)

(56) References Cited

U.S. PATENT DOCUMENTS

| | | | | | |
|---|---|---|---|---|---|
| 5,909,133 A | * | 6/1999 | Park | ...................... | G11C 7/222 |
| | | | | | 327/277 |
| 2006/0132212 A1 | * | 6/2006 | Shimazawa | ............ | H03K 5/133 |
| | | | | | 327/277 |
| 2023/0421156 A1 | * | 12/2023 | Hajri | ...................... | H03K 19/20 |

FOREIGN PATENT DOCUMENTS

CN　　　116032258 A　　4/2023

OTHER PUBLICATIONS

Je-Min Hung et al., An 8-Mb DC-Current-Free Binary-to-8b Precision ReRAM Nonvolatile Computing-in-Memory Macro using Time-Space-Readout with 1286.4—21.6TOPSNV for Edge-AI Devices, 2022 IEEE International Solid-State Circuits Conference.
(Continued)

*Primary Examiner* — Ly D Pham
(74) *Attorney, Agent, or Firm* — Scully, Scott, Murphy & Presser, P.C.

(57) ABSTRACT

A delay buffer unit and an operating method thereof, a computing device and an operating method thereof. The delay buffer unit includes a first-stage inverter, a second-stage inverter and a delay adjustment sub-unit, an input terminal of the first-stage inverter serves as an input terminal of the delay buffer unit; an input terminal of the second-stage inverter is connected with an output terminal of the first-
(Continued)

stage inverter, and an output terminal of the second-stage inverter serves as an output terminal of the delay buffer unit; the delay adjustment sub-unit is connected between a first terminal of the first-stage inverter and a first operating voltage terminal, and the delay adjustment sub-unit includes a memristor and is configured to adjust a transmission delay of the first-stage inverter by controlling and using the memristor according to a first control signal.

20 Claims, 10 Drawing Sheets

(51) Int. Cl.

| | |
| --- | --- |
| *H03K 5/133* | (2014.01) |
| *H03K 5/134* | (2014.01) |
| *H03L 7/081* | (2006.01) |
| *H03K 17/28* | (2006.01) |
| *H03K 17/284* | (2006.01) |

(52) U.S. Cl.
CPC .......... *G11C 13/0021* (2013.01); *H03K 5/133* (2013.01); *H03K 5/134* (2014.07); *H03K 17/28* (2013.01); *H03K 17/284* (2013.01)

(58) Field of Classification Search
USPC ........................................................ 365/148
See application file for complete search history.

(56) References Cited

OTHER PUBLICATIONS

Cheng-Xin Xue et al., A 22nm 4Mb 8b-Precision ReRAM Computing-in-Memory Macro with 11.91 to 195.7TOPS/W for Tiny AI Edge Devices, 2021 IEEE International Solid-State Circuits Conference.
Qi Liu et al., A Fully Integrated Analog ReRAM Based 78.4TOPS/W Compute-In-Memory Chip with Fully Parallel MAC Computing, 2020 IEEE International Solid-State Circuits Conference.

* cited by examiner

RRAM

DELAY BUFFER UNIT AND OPERATING METHOD THEREOF, COMPUTING DEVICE AND OPERATING METHOD THEREOF

CROSS-REFERENCE TO RELATED APPLICATION(S)

The present application claims priority of the Chinese Patent Applications No. 202211668042.3 filed on Dec. 23, 2022, the content of which is incorporated as a part of the present application.

TECHNICAL FIELD

Embodiments of the present disclosure relate to a delay buffer unit and an operating method thereof, a computing device and an operating method thereof.

BACKGROUND

Memristor (for example, resistive memory, phase change memory, conductive bridge memory, etc.) is a non-volatile device that can adjust its conductance state by applying external excitation. As a two-terminal device, the memristor has the characteristics of adjustable resistance and non-volatile, and thus are widely used in storage and computing integration. According to Kirchhoff's current law and Ohm's law, an array composed of memristors can perform parallel multiplication and accumulation calculation, and both storage and computing occur in devices of the array.

Because the memristor has characteristics of high speed, low power consumption, and compatibility with CMOS technology, for the memristor based on storage and computing integration as a new computing method, compared with the traditional von Neumann architecture, the integrated design of storage and computing can avoid a huge delay and energy overhead caused by data movement, which has natural advantages in the application of neural network, especially matrix-vector multiplication, and can reduce the computational complexity of the matrix-vector multiplication from $o(n^2)$ to $o(1)$.

SUMMARY

At least one embodiment of the present disclosure provides a delay buffer unit, the delay buffer unit includes: a first-stage inverter, a second-stage inverter and a delay adjustment sub-unit, an input terminal of the first-stage inverter serves as an input terminal of the delay buffer unit; an input terminal of the second-stage inverter is connected with an output terminal of the first-stage inverter, and an output terminal of the second-stage inverter serves as an output terminal of the delay buffer unit; the delay adjustment sub-unit is connected between a first terminal of the first-stage inverter and a first operating voltage terminal, and the delay adjustment sub-unit includes a memristor and is configured to adjust a transmission delay of the first-stage inverter by controlling and using the memristor according to a first control signal.

For example, in the delay buffer unit provided by at least one embodiment of the present disclosure, the delay adjustment sub-unit further includes a control switch, the control switch includes a first electrode, a second electrode and a control electrode, the control electrode receives the first control signal to conduct or cut off the first electrode and the second electrode according to the first control signal, the first electrode of the control switch is electrically connected with the first terminal of the first-stage inverter; a first terminal of the memristor is electrically connected with the first electrode of the control switch and the first terminal of the first-stage inverter, and a second terminal of the memristor is electrically connected with the first operating voltage terminal.

For example, in the delay buffer unit provided by at least one embodiment of the present disclosure, the second electrode of the control switch is electrically connected with the first operating voltage terminal, or with a second operating voltage terminal that is different from the first operating voltage terminal.

At least one embodiment of the present disclosure further provides an operating method of a delay buffer unit, the operating method includes: receiving an input signal of the delay buffer unit at the input terminal of the first-stage inverter, and outputting an output signal of the delay buffer unit at the output terminal of the second-stage inverter; and receiving the first control signal by the delay adjustment sub-unit, and adjusting the transmission delay of the first-stage inverter by controlling and using the memristor according to the first control signal.

For example, in the operating method provided by at least one embodiment of the present disclosure, the delay adjustment sub-unit further includes a control switch, the control switch includes a first electrode, a second electrode and a control electrode, and a first terminal of the memristor is electrically connected with the first electrode of the control switch, the receiving the first control signal by the delay adjustment sub-unit, and adjusting the transmission delay of the first-stage inverter by controlling and using the memristor according to the first control signal, includes:

controlling whether to access the memristor between the first terminal of the first-stage inverter and the first operating voltage terminal by the control switch according to the first control signal; and changing a source degeneracy resistance of the first-stage inverter based on the input signal by using the memristor to adjust the transmission delay of the first-stage inverter.

For example, in the operating method provided by at least one embodiment of the present disclosure, in a case where the memristor is accessed between the first terminal of the first-stage inverter and the first operating voltage terminal according to the first control signal, the transmission delay of the first-stage inverter is a transmission delay adjusted by the memristor; and in a case where the memristor is bypassed between the first terminal of the first-stage inverter and the first operating voltage terminal according to the first control signal, the transmission delay of the first-stage inverter is an intrinsic delay of the first-stage inverter.

For example, the operating method provided by at least one embodiment of the present disclosure further includes: disconnecting a conductive path between the delay adjustment sub-unit and the first-stage inverter according to the input signal; and connecting the delay adjustment sub-unit with the first operating voltage terminal and a second operating voltage terminal to perform a first processing operation on the memristor according to the first control signal.

For example, in the operating method provided by at least one embodiment of the present disclosure, the delay adjustment sub-unit further includes a control switch, the control switch includes a first electrode, a second electrode and a control electrode, and a first terminal of the memristor is electrically connected with the first electrode of the control switch, the connecting the delay adjustment sub-unit with the first operating voltage terminal and a second operating voltage terminal to perform a first processing operation on the memristor according to the first control signal, includes:

connecting the second electrode of the control switch with the first operating voltage terminal, and connecting a second terminal of the memristor with the second operating voltage terminal;

turning on the control switch according to the first control signal to adjust a resistance value of the memristor by a first processing operating voltage between the first operating voltage terminal and the second operating voltage terminal.

For example, in the operating method provided by at least one embodiment of the present disclosure, the first processing operation includes a set operation, a reset operation, a read operation or an initialization operation.

At least one embodiment of the present disclosure further provides a computing device, the computing device includes: a delay computing array, including 2M rows and N columns of delay buffer units, 2N word lines corresponding to the N columns, N bit lines corresponding to the N columns, and 2M source lines corresponding to the 2M rows, wherein N delay buffer units in each of the 2M rows are connected in series to form a row of delay chain, each two adjacent rows of delay chains constitute a delay processing combination, two rows of delay chains in each delay processing combination receive a same input signal; two delay buffer units located in a same column in each delay processing combination are respectively connected with two word lines corresponding to the same column; each of the delay buffer units includes a first-stage inverter, a second-stage inverter and a delay adjustment sub-unit, an input terminal of the first-stage inverter serves as an input terminal of the delay buffer unit, an input terminal of the second-stage inverter is connected with an output terminal of the first-stage inverter, and an output terminal of the second-stage inverter serves as an output terminal of the delay buffer unit, the delay adjustment sub-unit is connected with a first terminal of the first-stage inverter, and is connected with a source line corresponding to a row where the delay adjustment sub-unit is located, a bit line corresponding to a column where the delay adjustment sub-unit is located, and a word line corresponding to the column where the delay adjustment sub-unit is located, the delay adjustment sub-unit includes a memristor, and is configured to adjust a transmission delay of the first-stage inverter by controlling and using the memristor according to a first control signal provided by a corresponding word line.

For example, in the computing device provided by at least one embodiment of the present disclosure, the delay adjustment sub-unit further includes a control switch, the control switch includes a first electrode, a second electrode and a control electrode, the control electrode of the control switch is connected with the word line corresponding to the column where the delay adjustment sub-unit is located, the first electrode of the control switch is connected with the first terminal of the first-stage inverter and a first terminal of the memristor, and the second electrode of the control switch is connected with the source line corresponding to the row where the delay adjustment sub-unit is located, a second terminal of the memristor is connected with the bit line corresponding to the column where the delay adjustment sub-unit is located.

For example, the computing device provided by at least one embodiment of the present disclosure further includes: at least one delay charge conversion module, connected with the delay processing combination, and configured to quantify a delay difference of output signals of the two rows of delay chains in the delay processing combination into a voltage output signal; at least one analog-to-digital conversion module, connected with the delay charge conversion module, and configured to convert the voltage output signal outputted from the delay charge conversion module into a digital signal.

For example, in the computing device provided by at least one embodiment of the present disclosure, the computing device includes a plurality of delay charge conversion modules, the plurality of delay charge conversion modules are connected with one analog-to-digital conversion module to time-division multiplex the analog-to-digital conversion module.

For example, the computing device provided by at least one embodiment of the present disclosure further includes: an intrinsic delay calibration module, connected with the delay processing combination, and configured to calibrate intrinsic delays of the two rows of delay chains so that the intrinsic delays of the two rows of delay chains match with each other.

At least one embodiment of the present disclosure provides an operating method of the abovementioned computing device, the operating method includes: controlling at least one delay processing combination in the delay computing array through the 2N word lines according to a control signal combination, wherein the control signal combination includes 2N first control signals that are respectively applied to the 2N word lines; applying corresponding input signals respectively to input terminals of the at least one delay processing combination, and receiving output signals obtained by delay processing the corresponding input signals at output terminals of the at least one delay processing combination.

For example, the operating method provided by an embodiment of the present disclosure further includes: for each delay buffer unit in the delay processing combination, selecting an operation mode according to the corresponding input signals, and performing an operation corresponding to the operation mode according to the control signal combination.

For example, in the operating method provided by at least one embodiment of the present disclosure, the operating mode includes a first operating mode and a second operating mode, and the operating method further includes: in a first operating mode, connecting a bit line of a column where the delay buffer unit is located with a first operating voltage terminal, and connecting a source line of a row where the delay buffer unit is located with a second operating voltage terminal, and performing a first processing operation on a memristor in the delay buffer unit according to a first control signal corresponding to the delay buffer unit; in the second operating mode, connecting the bit line of the column where the delay buffer unit is located and a source line of a row where the delay buffer unit is located with the first operating voltage terminal, and performing a computing operation or a calibration read operation on the at least one delay processing combination according to the control signal combination.

For example, in the operating method provided by at least one embodiment of the present disclosure, performing a computing operation on at least one delay processing combination as selected according to the control signal combination, includes: applying 2N first control signals as computing input signals to 2N delay buffer units in the at least one delay processing combination through the 2N word lines; obtaining a differential delay computing result from an output terminal of the at least one delay processing combination.

For example, in the operating method provided by at least one embodiment of the present disclosure, performing a calibration read operation on at least one delay processing combination selected according to the control signal combination, includes: determining a target column in the at least one delay processing combination for performing the calibration read operation; applying a first control signal for accessing the memristor and a first control signal for bypassing the memristor respectively to two delay buffer units in the target column in the at least one delay processing combination; applying a first control signal for bypassing the memristor to a plurality of columns other than the target column in the at least one delay processing combination; and obtaining a differential delay read result at the output terminal of the at least one delay processing combination.

For example, the operating method provided by at least one embodiment of the present disclosure further includes: determining whether to perform the first processing operation on at least one memristor in the two delay buffer units on the target column according to the differential delay read result; in the case where the differential delay reading result does not reach an expected weight value, performing the first processing operation again on the at least one memristor.

For example, in the operating method provided by at least one embodiment of the present disclosure, the first processing operation includes a set operation, a reset operation, a read operation or an initialization operation.

BRIEF DESCRIPTION OF DRAWINGS

In order to more clearly explain the technical solution of the embodiments of the present disclosure, the accompanying drawings of the embodiments will be briefly introduced below. Obviously, the accompanying drawings in the following description only relate to some embodiments of the present disclosure, and are not limited to the present disclosure.

DETAILED DESCRIPTION

Figure 1A:
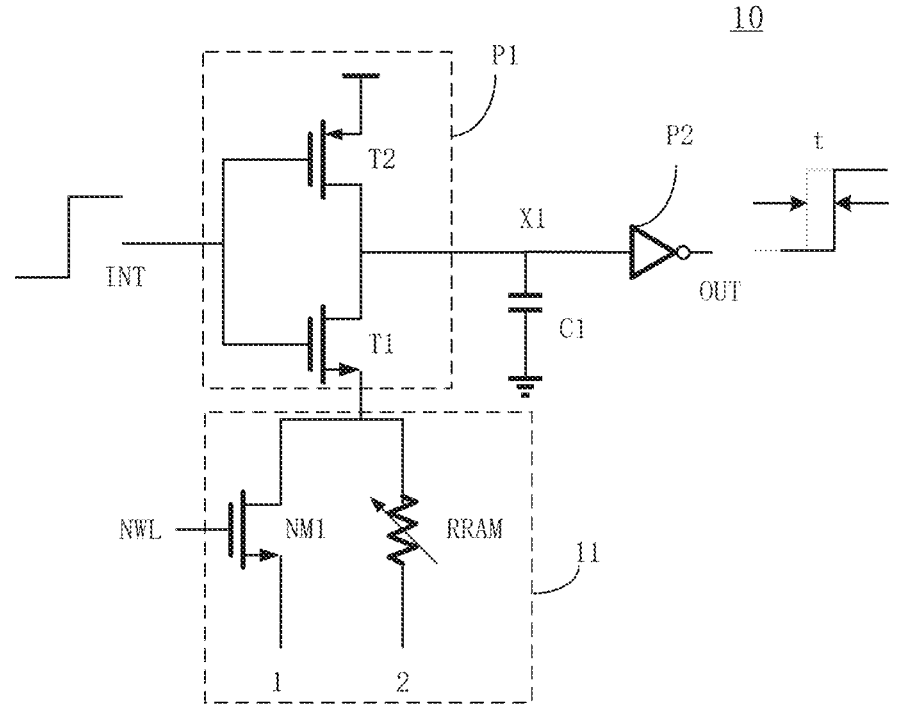
FIG. 1A is a structural schematic diagram of an exemplary delay buffer unit provided by at least one embodiment of the present disclosure.

In order to make the purpose, technical solution and advantages of the embodiments of the present disclosure more clear, the technical solution of the embodiments of the present disclosure will be described clearly and completely with the accompanying drawings. Obviously, the described embodiments are a part of the embodiments of the present disclosure, not the whole embodiments. Based on the described embodiments of the present disclosure, all other embodiments obtained by ordinary skilled in the field without creative labor belong to the scope of protection of the present disclosure.

Unless otherwise defined, technical terms or scientific terms used in the present disclosure shall have their ordinary meanings as understood by people with ordinary skills in the field to which the present disclosure belongs. The terms "first", "second" and the like used in the present disclosure do not indicate any order, quantity or importance, but are only used to distinguish different components. Similar words such as "including" or "comprising" refer to that the elements or objects appearing before the word cover the elements or objects listed after the word and their equivalents, without excluding other elements or objects. Similar words such as "connected" or "connected" are not limited to physical or mechanical connection, but can include electrical connection, whether direct or indirect. "Up", "Down", "Left" and "Right" are only used to indicate the relative positional relationship. When the absolute position of the described object changes, the relative positional relationship may also change accordingly.

The present disclosure will be explained by several specific embodiments. In order to keep the following description of the embodiments of the present disclosure clear and concise, detailed descriptions of known functions and known components may be omitted. When any part of an embodiment of the present disclosure appears in more than one drawing, the part is represented by the same or similar reference numeral in each drawing.

Memristor is a new type of information processing device that has a function of merging storage and computing, it can perform computing operations on a stored data in situ, thereby eliminating a huge overhead of data movement. In addition, the memristor can directly perform calculations in an analog domain (for example, the memristor can complete multiplication calculations based on Ohm's law and accumulation calculations based on Kirchhoff's current law), thereby realizing matrix-vector multiplication calculation in one step, and no digital-to-analog conversion overhead is required in the calculation process. In recent years, storage and computing integration based on the memristor has made significant progress. However, because a power supply support for a terminal device is limited, a storage and computing integration device based on the memristor is required not only to have higher precision calculations, but also to have lower energy consumption and higher energy efficiency. Therefore, the storage and computing integration design of the memristor has undergone numerous improvements in terms of both array structure and peripheral circuit design.

For example, an improved solution is a voltage domain quantization solution, which uses a voltage pre-charging type reading solution to replace the current type reading solution with excessive static current overhead, but an outputting range of this solution is limited. For example, another improved solution is a time domain quantization method, which converts outputting results to a time domain to increase the outputting range, thereby making it easier and more efficient to distinguish different outputting states, however, the outputting of the time domain quantization has nonlinear problems. Moreover, whether the voltage domain or the time domain quantization solution, it is needed to deal with the large current flowing through the memristor array in the case where the memristor array is turned on in parallel, the large current on the memristor array and its peripheral circuits will cause large power consumption. For example, another improved solution is a current type simulation computing solution based on a 2T2R array structure, which alleviates the IR drop problem of wiring by reducing the accumulated outputting current, and is a computing method with high parallelism and computing power, however, in order to ensure the computing accuracy, this computing method requires large inputting power consumption and clamping circuit power consumption, and in the case where the array scale is large, this computing method will also generate large power consumption. Therefore, how to achieve low energy consumption and high energy efficiency in the storage and computing integration has become an urgent problem to be solved.

At least one embodiment of the present disclosure provides a delay buffer unit and an operating method thereof, the delay buffer unit includes: a first-stage inverter, a second-stage inverter and a delay adjustment sub-unit, an input terminal of the first-stage inverter serves as an input terminal of the delay buffer unit; an input terminal of the second-stage inverter is connected with an output terminal of the first-stage inverter, and an output terminal of the second-stage inverter serves as an output terminal of the delay buffer unit; the delay adjustment sub-unit is connected between a first terminal of the first-stage inverter and a first operating voltage terminal, and the delay adjustment sub-unit includes a memristor and is configured to adjust a transmission delay of the first-stage inverter by using the memristor according to a first control signal.

The operating method of the delay buffer unit includes: receiving an input signal of the delay buffer unit at the input terminal of the first-stage inverter, and outputting an output signal of the delay buffer unit at the output terminal of the second-stage inverter; and receiving the first control signal by the delay adjustment sub-unit, and adjusting the transmission delay of the first-stage inverter by using the memristor according to the first control signal.

The delay buffer unit and the operating method thereof provided by at least one embodiment of the present disclosure can change the transmission delay of the delay buffer unit according to whether the memristor is used, and can further change the transmission delay of the buffer unit by controlling the changing of the resistance value of the memristor, thereby realizing dynamic regulation of the delay buffer unit, and flexibly and efficiently adjusting the size of the delay according to actual needs. Moreover, in at least one embodiment of the present disclosure, the delay buffer unit can further be configured to implement matrix-vector multiplication of the storage and computing integration, and can map the computing weight to the delay of the delay buffer unit in the case where a plurality of delay buffer units are cascaded, and the cumulative delay obtained from the output terminal of the plurality of delay buffer units is used as the outputting result of the matrix-vector multiplication.

At least one embodiment of the present disclosure further provides a computing device and an operating method thereof, the computing device includes a delay computing array, the delay computing array includes 2M rows and N columns of delay buffer units, 2N word lines corresponding to the N columns, N bit lines corresponding to the N columns, and 2M source lines corresponding to the 2M rows, N delay buffer units in of the 2M rows are connected in series to form a row of delay chain, each two adjacent rows of delay chains constitute a delay processing combination, two rows of delay chains in each delay processing combination receive a same input signal; two delay buffer units located in a same column in each delay processing combination are respectively connected with two word lines corresponding to the same column; each of the delay buffer units includes a first-stage inverter, a second-stage inverter and a delay adjustment sub-unit, an input terminal of the first-stage inverter serves as an input terminal of the delay buffer unit, an input terminal of the second-stage inverter is connected with an output terminal of the first-stage inverter, and an output terminal of the second-stage inverter serves as an output terminal of the delay buffer unit, the delay adjustment sub-unit is connected with a first terminal of the first-stage inverter, and is connected with a source line corresponding to a row where the delay adjustment sub-unit is located, a bit line corresponding to a column where the delay adjustment sub-unit is located, and a word line corresponding to the column where the delay adjustment sub-unit is located, the delay adjustment sub-unit includes a memristor, and is configured to adjust a transmission delay of the first-stage inverter by controlling and using the memristor according to a first control signal provided by a corresponding word line.

The operating method of the computing device includes: controlling at least one delay processing combination in the delay computing array through the 2N word lines according to a control signal combination, the control signal combination comprises 2N first control signals that are respectively applied to the 2N word lines; applying corresponding input signals respectively to input terminals of the at least one delay processing combination, and receiving output signals obtained by delay processing the corresponding input signals at output terminals of the at least one delay processing combination.

The computing device and the computing method thereof provided by at least one embodiment of the present disclosure can utilize the delay buffer unit to realize the storage and computing integration, by converting the computing result of the matrix vector multiplication into the delay of the delay buffer unit, large-scale matrix operations with high precision and low energy consumption can be achieved, and the computing efficiency of the matrix-vector multiplication calculation can be improved.

Hereinafter, a plurality of embodiments of the delay buffer unit and the operating method thereof and the computing device and the operating method thereof of the present disclosure will be described below.

Figure 1B:
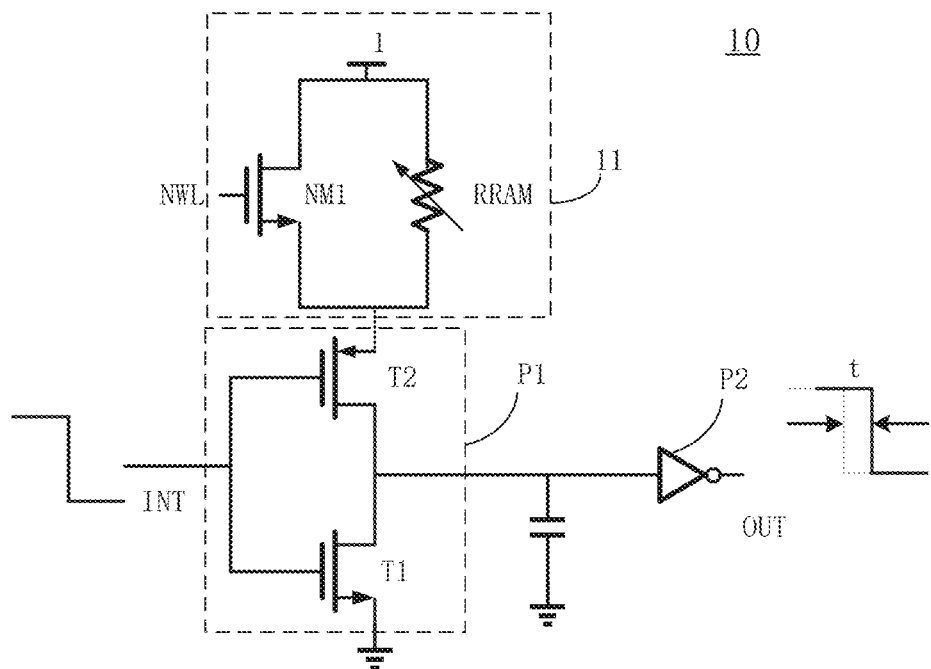
FIG. 1B is a structural schematic diagram of another exemplary delay buffer unit provided by at least one embodiment of the present disclosure.

FIG. 1A illustrates a structural schematic diagram of a delay buffer unit according to at least one embodiment of the present disclosure; FIG. 1B illustrates a structural schematic diagram of another exemplary delay buffer unit according to at least one embodiment of the present disclosure. The circuit structure of the delay buffer unit will be described in detail below with reference to FIG. 1A and FIG. 1B.

As illustrated in FIG. 1A and FIG. 1B, the delay buffer unit 10 includes a first-stage inverter P1, a second-stage inverter P2 and a delay adjustment sub-unit 11.

For example, an input terminal of the first-stage inverter P1 serves as an input terminal INT of the delay buffer unit 10. An input signal of the delay buffer unit can be received from the input terminal of the first-stage inverter P1, the input signal can be, for example, a rising edge trigger signal (as illustrated in FIG. 1A) or a falling edge trigger signal (as illustrated in FIG. 1B). For example, the first-stage inverter P1 includes a transistor T1 and a transistor T2, the transistor T1 is, for example, an NMOS transistor, and the transistor T2 is, for example, a PMOS transistor, the gate terminal of the transistor T1 and the gate terminal of the transistor T2 can be configured as the input terminal, that is, as the input terminal INT of the delay buffer unit 10 to receive the input signal. For example, in the case where the input signal is high-level, the transistor T1 is turned on and the transistor T2 is turned off, in the case where the input signal is low-level, the transistor T1 is turned off and the transistor T2 is turned on. The drain terminal of the transistor T1 and the drain terminal of the transistor T2 are electrically connected with each other and serve as an output terminal of the first-stage inverter P1. The source terminal of the transistor T1 or the source terminal of the transistor T2 can be connected with a ground terminal or a power supply terminal, and can also serve as a first terminal of the first-stage inverter P1.

For example, an input terminal of the second-stage inverter P2 is connected with the output terminal of the first-stage inverter P1, and an output terminal of the second-stage inverter P2 serves as an output terminal OUT of the delay buffer unit 10. The circuit structure of the second-stage inverter P2 is similar to that of the first-stage inverter P1 and will not be described again here. It should be noted that, the circuit structure of the first-stage inverter P1 and the second-stage inverter P2 can further be implemented as other structures, and the embodiments of the present disclosure are not limited thereto.

For example, an output signal of the delay buffer unit 10 can be outputted from the output terminal of the second-stage inverter P2, the output signal corresponds to the input signal and has a certain delay relative to the input signal, the delay consists of transmission delays of the first-stage inverter P1 and the second-stage inverter P2. For example, as illustrated in FIG. 1A, in the case where the input signal received from the input terminal INT of the delay buffer unit 10 is a rising edge trigger signal, the output signal outputted from the output terminal OUT of the delay buffer unit 10 (gray line and black line at the output terminal OUT in FIG. 1A represent the rising edge trigger signal and the output signal respectively) has a certain delay t relative to the rising edge trigger signal. For example, as illustrated in FIG. 1B, in the case where the input signal received from the input terminal INT of the delay buffer unit 10 is a falling edge trigger signal, the output signal outputted from the output terminal OUT of the delay buffer unit 10 (gray line and black line at the output terminal OUT in FIG. 1B represent the falling edge trigger signal and the output signal respectively) has a certain delay t relative to the falling edge trigger signal.

For example, the delay adjustment sub-unit 11 is connected between the first terminal of the first-stage inverter P1 and a first operating voltage terminal 1, and the delay adjustment sub-unit 11 includes a memristor (here, the resistive memory (RRAM) is taken as an example), the delay adjustment sub-unit 11 is configured to adjust a transmission delay of the first-stage inverter P1 by controlling and using the memristor RRAM according to the first control signal. For example, the first control signal is provided by a first control terminal NWL, and is configured to control whether the delay adjustment sub-unit 11 uses the memristor RRAM to adjust the transmission delay of the first-stage inverter P1, thereby adjusting a delay difference (delay t) between the output signal and the input signal of the delay buffer unit 10.

For example, the delay adjustment sub-unit 11 further includes a control switch, and the control switch may be an N-type transistor or a P-type transistor, the embodiments of the present disclosure are not limited thereto. The control switch (here, the N-type transistor (NM1) is taken as an example) includes a first electrode, a second electrode, and a control electrode, and the first electrode, the second electrode, and the control electrode of the control switch NM1 may be, for example, the source electrode, the drain electrode and the gate electrode of the N-type transistor respectively. The control electrode of the control switch NM1 is connected with the first control terminal NWL, the control switch NM1 receives a first control signal from the first control terminal NWL, and conducts or cuts off the first electrode and the second electrode of the control switch NM1 according to the first control signal. For example, the first electrode of the control switch NM1 is electrically connected with the first terminal of the first-stage inverter P1, and the second electrode of the control switch NM1 is electrically connected with the first operating voltage terminal 1, in the case where the control switch NM1 is turned on, the first-stage inverter P1 is connected with the first operating voltage terminal 1, and in the case where the control switch NM1 is turned off, the first-stage inverter P1 is disconnected from the first operating voltage terminal 1. The control switch NM1 may be an N-type transistor (as illustrated in FIG. 1A) or a P-type transistor, the embodiments of the present disclosure are not limited thereto.

For example, the memristor RRAM in the delay adjustment sub-unit 11 includes a first terminal and a second terminal, the first terminal of the memristor RRAM is electrically connected with the first electrode of the control switch NM1 and the first terminal of the first-stage inverter P1. In at least one embodiment of the present disclosure, the second terminal of the memristor RRAM and the second electrode of the control switch NM1 may be connected with the same operating voltage terminal or different operating voltage terminals. Here, the second terminal of the memristor RRAM and the second electrode of the control switch NM1 being connected with the same operating voltage terminal refers to that the voltage signals obtained by the two from the same (or different) operating voltage terminal are the same, the second terminal of the memristor RRAM and the second electrode of the control switch NM1 being connected with different operating voltage terminals refers to that the voltage signals obtained by the two from different operating voltage terminals are different.

For example, in one example, the second terminal of the memristor RRAM is electrically connected with the first operating voltage terminal 1 (as illustrated in FIG. 1B), that is, both of the second terminal of the memristor RRAM and the second electrode of the control switch NM1 are connected with the first operating voltage terminal, the first operating voltage terminal 1 may be, for example, a power supply terminal (as illustrated in FIG. 1B) or a ground terminal. For example, in another example, as illustrated in FIG. 1A, the second terminal of the memristor RRAM is electrically connected with a second operating voltage terminal 2, the second electrode of the control switch NM1 is electrically connected with the first operating voltage terminal 1, the first operating voltage terminal 1 and the second operating voltage terminal 2 provide different voltage signals. For example, in another example, the second terminal of the memristor RRAM is electrically connected with the first operating voltage terminal 1, the second electrode of the control switch NM1 is electrically connected with the second operating voltage terminal 2, and the first operating voltage terminal 1 and the second operating voltage terminal 2 are different.

In at least one embodiment of the present disclosure, the delay adjustment sub-unit 11 is connected with the first terminal of the first-stage inverter P1, for example, connected with the source terminal of the first-stage inverter P1. For example, as illustrated in FIG. 1A, the delay adjustment sub-unit 11 is connected between a NMOS transistor T1 in the first-stage inverter P1 and the first operating voltage terminal 1. For example, in the delay adjustment sub-unit 11 illustrated in FIG. 1A, the first electrode (such as the drain electrode) of the control switch NM1 is connected with the source terminal of the NMOS transistor T1 in the first-stage inverter P1, and the first terminal of the memristor RRAM is connected with the source terminal of the NMOS transistor T1 in the first-stage inverter P1. For example, as illustrated in FIG. 1B, the delay adjustment sub-unit 11 is connected between a PMOS transistor T2 in the first-stage inverter P1 and the first operating voltage terminal 1. For example, in the delay adjustment sub-unit 11 as illustrated in FIG. 1B, the first electrode (such as the source electrode) of the control switch NM1 is connected with the source terminal of the PMOS transistor T2 in the first-stage inverter P1, and the first terminal of the memristor RRAM is connected with the source terminal of the PMOS transistor T2 in the first-stage inverter P1.

It should be noted that the transistors adopted in the embodiments of the present disclosure may be thin film transistors or field effect transistors (such as MOS field effect transistors) or other switching devices with the same characteristics. The source electrode and drain electrode of the transistor adopted here can be symmetrical in structure, so no structural difference exists between the source electrode and drain electrode in structure. The embodiments of the present disclosure do not limit the type of the transistor adopted.

For example, the delay buffer unit 10 further includes a capacitor C, a first electrode of the capacitor C1 is connected between the output terminal of the first-stage inverter P1 and the input terminal of the second-stage inverter P2, a second electrode of the capacitor C1 is connected with ground. The capacitor C1 may be, for example, a specially prepared capacitor element or a parasitic capacitor, which is not limited in the embodiments of the present disclosure.

The operating method of the delay buffer unit 10 in at least one embodiment of the present disclosure will be described below. The operating method includes the following steps S100 and S200:

Step S100: receiving an input signal of the delay buffer unit at the input terminal of the first-stage inverter, and outputting an output signal of the delay buffer unit at the output terminal of the second-stage inverter;

Step S200: receiving the first control signal by the delay adjustment sub-unit, and adjusting the transmission delay of the first-stage inverter by using the memristor according to the first control signal.

For example, in Step S100, the input terminal INT of the first-stage inverter P1 receives the input signal of the delay buffer unit 10, the input signal may be, for example, a rising edge trigger signal (as illustrated in FIG. 1A) or a falling edge trigger signal (as illustrated in FIG. 1B). The output signal of the delay buffer unit 10 is outputted at the output terminal OUT of the second-stage inverter P2, the output signal corresponds to the input signal and has a certain delay relative to the input signal. This delay consists of a two-stage flip delay of the first-stage inverter P1 and the second-stage inverter P2, for example, the transmission delay of the first-stage inverter P1 can be the intrinsic delay of the first-stage inverter P1 or the transmission delay adjusted by the memristor, and the transmission delay of the second-stage inverter P2 is the intrinsic delay of the second-stage inverter P2.

For example, in at least one example of the embodiment of the present disclosure, Step S200, that is, receiving the first control signal by the delay adjustment sub-unit, and adjusting the transmission delay of the first-stage inverter by using the memristor according to the first control signal, a specific example of which may include: controlling whether to access the memristor between the first terminal of the first-stage inverter and the first operating voltage terminal by the control switch according to the first control signal; and changing the source degeneracy resistance of the first-stage inverter based on the input signal by using the memristor to adjust the transmission delay of the first-stage inverter.

According to an embodiment of the present disclosure, in the case where the memristor is bypassed between the first terminal of the first-stage inverter and the first operating voltage terminal by the control switch according to the first control signal, the transmission delay of the first-stage inverter is an intrinsic delay of the first-stage inverter. In the case where the memristor is accessed between the first terminal of the first-stage inverter and the first operating voltage terminal according to the first control signal, the transmission delay of the first-stage inverter is a transmission delay adjusted by the memristor.

For example, in the delay buffer unit 10 illustrated in FIG. 1A, the second electrode of the control switch NM1 and the second terminal of the memristor RRAM in the delay adjustment sub-unit 11 are connected with the same operating voltage terminal, such as the ground terminal, or, the second electrode of the control switch NM1 and the second terminal of the memristor RRAM in the delay adjustment sub-unit 11 are connected with the first operating voltage terminal 1 and the second operating voltage terminal 2 respectively, and the first operating voltage terminal 1 and the second operating voltage terminal 2 are both connected with ground.

For example, in the case where the input signal received from the input terminal INT of the delay buffer unit 10 is a high-level signal, the PMOS transistor T2 in the first-stage inverter P1 is turned off, and the NMOS transistor T1 is turned on, that is, a conductive path between the delay adjustment sub-unit 11 and the first-stage inverter P1 is turned on according to the input signal. In this case, the delay adjustment sub-unit 11 can control whether to connect the memristor between the first terminal (the source terminal of T1) of the first-stage inverter P1 and the first operating voltage terminal 1 by controlling the switch NM1 and according to the first control signal, thereby adjusting the delay difference t between the rising edge of the output signal and the rising edge of the input signal.

For example, in the case where the first control signal received by the delay adjustment sub-unit 11 is high-level, the control switch NM1 is turned on, so that the first-stage inverter P1 is conductive to the ground terminal through the control switch NM1, thereby causing the memristor RRAM is bypassed. At this time, the delay t between the output signal and the input signal of the delay buffer unit 10 is the sum of the intrinsic delay of the first-stage inverter P1 and the intrinsic delay of the second-stage inverter P2.

For example, in the case where the first control signal received by the delay adjustment sub-unit 11 is low-level, the control switch NM1 is turned off, so that the first-stage inverter P1 is conductive to the ground terminal through the memristor RRAM, that is, the memristor RRAM is connected between the first terminal of the first-stage inverter P1 (for example, the source terminal of T1) and the first operating voltage terminal (the ground terminal). At this time, the delay t between the output signal and the input signal of the delay buffer unit 10 is the sum of the transmission delay of the first-stage inverter P1 adjusted by the memristor and the intrinsic delay of the second-stage inverter P2.

For example, in the case where the memristor is connected, the resistance value of the memristor determines the source degeneracy resistance of the first-stage inverter P1, which in turn affects the discharge speed of the charge, therefore, the delay of the delay buffer unit 10 can be adjusted by changing the resistance value of the memristor. That is, in the case where the resistance value of the memristor is small, the discharge speed of the charge is fast, and the outputting delay t of the delay buffer unit 10 is small; in the case where the resistance value of the memristor is large, the discharge speed of the charge is slow, and the outputting delay t of the delay buffer unit 10 is large.

For example, in the delay buffer unit 10 illustrated in FIG. 1B, the second electrode (for example, the drain electrode) of the control switch NM1 in the delay adjustment sub-unit 11 and the second terminal of the memristor RRAM are connected with the same operating voltage terminal, such as power supply terminal.

For example, in the case where the input signal received from the input terminal INT of the delay buffer unit 10 is a low-level signal, the NMOS transistor T1 in the first-stage inverter P1 is turned off, and the PMOS transistor T2 is turned on, that is, a conductive path between the delay adjustment sub-unit 11 and the first-stage inverter P1 is turned on according to the input signal. In this case, the delay adjustment sub-unit 11 can control whether to connect the memristor between the first terminal (the source terminal of T2) of the first-stage inverter P1 and the first operating voltage terminal 1 by controlling the switch NM1 and according to the first control signal, thereby adjusting the delay difference t between the falling edge of the output signal and the falling edge of the input signal.

For example, in the case where the first control signal received by the delay adjustment sub-unit 11 is high-level, the control switch NM1 is turned on, so that the first-stage inverter P1 is conductive to the power supply terminal through the control switch NM1, thereby causing the memristor RRAM is bypassed. At this time, the delay t between the output signal and the input signal of the delay buffer unit 10 is the sum of the intrinsic delay of the first-stage inverter P1 and the intrinsic delay of the second-stage inverter P2.

For example, in the case where the first control signal received by the delay adjustment sub-unit 11 is low-level, the control switch NM1 is turned off, so that the first-stage inverter P1 is conductive to the power supply terminal through the memristor RRAM, that is, the memristor RRAM is connected between the first terminal of the first-stage inverter P1 (for example, the source terminal of T2) and the first operating voltage terminal 1 (the power supply terminal). At this time, the delay t between the output signal and the input signal of the delay buffer unit 10 is the sum of the transmission delay of the first-stage inverter P1 adjusted by the memristor and the intrinsic delay of the second-stage inverter P2.

For example, in the case where the memristor is connected, the resistance value of the memristor determines the source degeneracy resistance of the first-stage inverter P1, in the case where the source degeneracy resistance connected in series with the capacitor changes, the discharge speed of the charge changes accordingly, so the delay of the delay buffer unit 10 can be adjusted by changing the resistance value of the memristor. That is, in the case where the resistance value of the memristor is small, the charging speed of the charge is fast, and the outputting delay t of the delay buffer unit 10 is small; in the case where the resistance value of the memristor is large, the charging speed of the charge is slow, and the outputting delay t of the buffer unit 10 is large.

The above operating method may further include step S300 and step S400:

Step S300: disconnecting the conductive path between the delay adjustment sub-unit and the first-stage inverter according to the input signal;

Step S400: connecting the delay adjustment sub-unit with the first operating voltage terminal and the second operating voltage terminal to perform a first processing operation on the memristor according to the first control signal.

For example, in the delay buffer unit 10 illustrated in FIG. 1A, in the case where the input signal received from the input terminal INT of the delay buffer unit 10 is a low-level signal, the NMOS transistor T1 in the first-stage inverter P1 is turned off, the PMOS transistor T2 is turned on, thereby disconnecting the conductive path between the delay adjustment sub-unit 11 and the first-stage inverter P1. In this case, the delay adjustment sub-unit 11 may be connected with the first operating voltage terminal 1 and the second operating voltage terminal 2 to perform the first processing operation on the memristor RRAM according to the first control signal. For example, the first processing operation performed on the memristor RRAM may be a set operation, a reset operation, or an initialization operation to change the resistance value of the memristor.

For example, in at least one example of the embodiment of the present disclosure, Step S400, that is, connecting the delay adjustment sub-unit with the first operating voltage terminal and the second operating voltage terminal to perform a first processing operation on the memristor according to the first control signal, a specific example of which may include: connecting the second electrode of the control switch with the first operating voltage terminal, and connecting the second terminal of the memristor with the second operating voltage terminal; and turning on the control switch according to the first control signal to adjust the resistance value of the memristor by a first processing operating voltage between the first operating voltage terminal and the second operating voltage terminal.

For example, as illustrated in FIG. 1A, in the case where the conductive path between the delay adjustment sub-unit 11 and the first-stage inverter P1 is disconnected, the control switch NM1 in the delay adjustment sub-unit 11 is connected with the first operating voltage terminal, and the memristor is connected with the second operating voltage terminal, an operating voltage of the first processing operation is applied between the first operating voltage terminal and the second operating voltage terminal, thereby performing the first processing operation on the memristor.

The composition structure of the memristor and the process of performing the first processing operation on the memristor will be described below with reference to FIG. 2.

Figure 2:
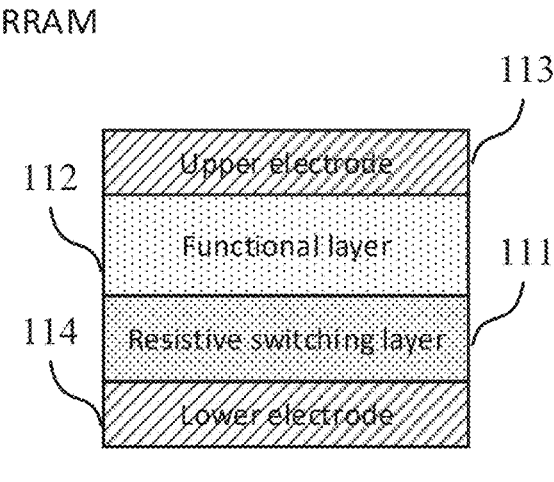
FIG. 2 is a structural schematic diagram of an exemplary memristor provided by at least one embodiment of the present disclosure.

FIG. 2 illustrates a structural schematic diagram of an exemplary memristor. As illustrated in FIG. 2, the memristor RRAM includes a resistive switching layer 111 and an upper electrode 113 (for example, the first terminal in the present disclosure) and a lower electrode 114 (for example, the second terminal in the present disclosure) located on both sides of the resistive switching layer 111, in at least one example, a functional layer 112 may further be included. The functional layer 112 is an optional layer, and it can be decided whether to add it or not according to the optimization direction of the memristor performance, and it can be designed accordingly. The resistive switching layer 111 may be, for example, a single layer, including a single type of binary metal oxide (such as NiO, AlOx, and the like), graphene oxide, multi-component perovskite oxide (such as STO, SZO, PCMO, and the like), or may be a plurality of layers, such as any optional stacking of the above materials, for example, may be a stacking of TixN and AlOx.

For the memristor (such as the resistive memory), it usually requires an additional initialization (Forming) process, after an initialization is completed, the resistance value of the memristor can change with the external voltage signal. Because no conductive filament exists inside the memristor in the case where the memristor is prepared, it is needed to form conductive filament inside the memristor through an initialization operation. The initialization operation usually only needs to be performed once during the life cycle of the memristor.

For example, in the delay buffer unit 10 illustrated in FIG. 1A, after the conductive path between the delay adjustment sub-unit 11 and the first-stage inverter P1 is disconnected, an initialization voltage can be applied between the first operating voltage terminal 1 and the second operating voltage terminal 2 to perform the initialization operation on the memristor, so that the conductive filament can be formed inside the memristor. For example, after the conductive filament is formed inside the memristor RRAM through the initialization, the memristor RRAM has a threshold voltage.

For example, the mainstream approach is that in the case where the amplitude of the inputting voltage applied between the upper electrode 113 and the lower electrode 114 of the memristor RRAM is less than the threshold voltage of the memristor RRAM, the resistance value of the memristor RRAM (or the conductivity value) cannot be changed. In this case, a read voltage can be applied between the first operating voltage terminal and the second operating voltage terminal to read the current resistance value of the memristor RRAM. The read voltage is less than the threshold voltage of the memristor RRAM, so that the current resistance value of the memristor can be read without changing the resistance value of the memristor.

For example, in the case where the amplitude of the inputting voltage applied between the upper electrode 113 and the lower electrode 114 of the memristor RRAM is larger than the threshold voltage of the memristor RRAM, the resistance value (or the conductance value) of the memristor RRAM can be changed according to the set voltage or reset voltage applied between the upper electrode 113 and the lower electrode 114 of the memristor RRAM. For example, the set voltage is a positive voltage pulse and the reset voltage is a negative voltage pulse. For example, applying the set voltage to the memristor RRAM can make the resistance value of the memristor RRAM smaller, and applying the reset voltage to the memristor RRAM can make the resistance value of the memristor RRAM larger. In the embodiments of the present disclosure, applying the set voltage to the memristor is called the set operation, and applying the reset voltage to the memristor is called the reset operation.

For example, for the delay buffer unit illustrated in FIG. 1A, in the case where the delay adjustment sub-unit 11 is disconnected from the first-stage inverter P1, the set voltage can be applied between the first operation voltage terminal and the second operation voltage terminal to decrease the resistance value of the memristor RRAM, thereby decreasing the outputting delay t of the delay buffer unit 10 by incorporating the RRAM with a small resistance value in the case where the delay adjustment sub-unit 11 is electrically connected with the first-stage inverter P1.

For example, in the case where the delay adjustment sub-unit 11 is disconnected from the first-stage inverter P1, the reset voltage can be applied between the first operating voltage terminal and the second operating voltage terminal to increase the resistance value of the memristor RRAM, thereby increasing the outputting delay t of the delay buffer unit 10 by incorporating the RRAM with a large resistance value in the case where the delay adjustment sub-unit 11 is electrically connected with the first-stage inverter P1.

Based on the above examples, the delay buffer unit and the operating method thereof provided by at least one embodiment of the present disclosure can change the transmission delay of the delay buffer unit according to whether a memristor is adopted, and can further change the transmission delay of the delay buffer unit by controlling the changing of the resistance value of the memristor, thereby realizing dynamic adjustment of the delay buffer unit, so that the size of the delay can be flexibly and efficiently adjusted according to actual needs.

In the case where the matrix-vector multiplication computation is performed, for example, when multiplying a vector V and a matrix G to obtain a corresponding vector I, the current solution of the storage and computing integration based on the memristor is to map the conductance matrix to the memristor array, that is, to map the values of a plurality of elements G11~Gmn of the matrix G (or computing weights in neural network) to the conductance values (or resistance values) of a plurality of memristors in the memristor array, and then map the values of a plurality of elements V1, V2, . . . , Vm of the inputting vector V to the plurality of inputting voltage values of the memristor array respectively, and the plurality of inputting voltages are correspondingly applied to a plurality of bit lines BL of the memristor array. According to Ohm's law and Kirchhoff's current law, the outputting current value of each source line SL is the value of the corresponding element I1, I2, . . . , In in the outputting vector I. As mentioned before, this solution of mapping the elements of the matrix to the resistance value of the memristor will cause large power consumption during parallel computing process due to limitations of computing physics.

In this regard, at least one embodiment of the present disclosure provides a computing device that utilizes a plurality of the above-mentioned delay buffer units to construct a computing array, in the case where the computing array is configured to perform a matrix multiplication and accumulation operation (for example, neural network forward computing), the matrix elements (computing weights) are respectively mapped to the delays of a plurality of delay buffer units, and the accumulated delays are obtained from the output terminals of the plurality of delay buffer units as the outputting results of the matrix-vector multiplication, therefore, the result of the multiplication and accumulation operation can be converted into a uniformly linear accumulation time of the plurality of delay buffer units (computation units) in the time domain, and no static current exists during the computing process, and only dynamic flipping power consumption exists, at the same time, circuits such as active operational amplifier circuit (such as quantization circuit) do not need to exist on the peripheral circuits of the calculation array, thereby achieving large-scale matrix operations with high precision, low energy consumption, and high energy efficiency.

Figure 3:
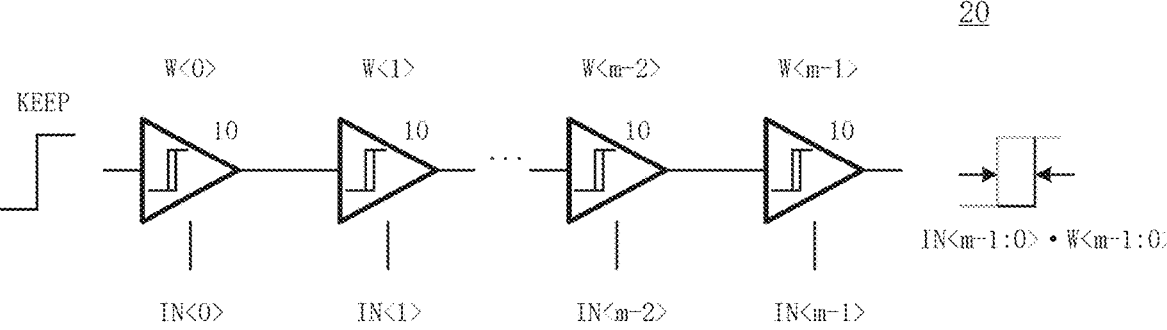
FIG. 3 is a block diagram of an exemplary delay chain provided by at least one embodiment of the present disclosure.

As illustrated in FIG. 3, the plurality of delay buffer units 10 are cascaded to form a row of delay chain 20, the input signal KEEP is received from the input terminal INT of the first delay buffer unit 10 of the delay chain 20, the input signal KEEP can be, for example, a rising edge trigger signal or a falling edge trigger signal. For the convenience of description, the following adopts the delay buffer unit 10 as illustrated in FIG. 1A as an example to introduce the matrix-vector multiplication calculation, in the case where the calculation is performed, the input signal KEEP is the rising edge trigger signal, the control switch NM1 and the memristor RRAM in the delay adjustment sub-unit 11 of the delay buffer unit 10 are connected with ground.

For example, each delay buffer unit 10 performs a multiplication calculation as a computing unit, and the cumulative delay of the plurality of delay buffer units 10 is outputted from the output terminal of the delay chain 20 as the result of the multiplication and accumulation calculation.

For example, before performing the computing, the elements of the matrix G (or the computing weights in the neural network) need to be mapped to the delay of the delay buffer unit 10, this delay can be obtained, for example, by adjusting the resistance value of the memristor in the delay buffer unit 10. For example, a column of elements G11, G21, . . . , Gm1 of the matrix G is respectively mapped to the delays W<0>, W<1>, . . . , W<m-1> of m delay buffer units 10 controlled by the memristor.

Then, in the case where the computing is performed, the element of the inputting vector V is mapped to the first control signal of the delay buffer unit 10, for example, the inputting element V1 of the inputting vector V is configured as the first control signals IN<0>, IN<1>, . . . , IN<m-1> of the plurality of cascaded delay buffer units 10, for example, the plurality of first control signals IN<0>, IN<1>, . . . , IN<m-1> can be fed in parallel to improve computing efficiency. The first control signals IN<0>, IN<1>, . . . , IN<m-1> corresponding to the inputting element V1 control whether a plurality of delays W<0>, W<1>, . . . , W<m-1> controlled by the memristor of the plurality of delay buffer units 10 are serialized into the delay chain 20. The cumulative delay IN<m-1:0>·W<m-1:0> at the output terminal of the delay chain 20 is the computing result of the vector inner product operation (multiplication and accumulation operation).

For example, for each delay buffer unit 10, in the case where the first control signal is low-level (corresponding to the inputting element V1 being 1), the memristor RRAM is connected between the first-stage inverter P1 and the first operating voltage terminal 1, at this time, the delay t of the delay buffer unit is the delay after being controlled by the resistance value of the memristor, that is, the delay controlled by the memristor is serialized into the delay chain; in the case where the first control signal is high-level (corresponding to the inputting element V1 being 0), the memristor RRAM is bypassed, and the memristor RRAM is not connected between the first-stage inverter P1 and the first operating voltage terminal 1, at this time, the delay t of the delay buffer unit is the intrinsic delay, that is, only the intrinsic delay is serialized into the delay chain.

Through the above computing operations, a vector inner product operation (multiplication and accumulation operation) of one inputting data (for example, 1 bit) and m weight elements can be implemented, but the embodiments of the present disclosure are not limit thereto, for example, a vector inner product operation between a plurality of inputting data (for example, 8 bit) and m weight elements can further be implemented, for example, the vector inner product operation of the plurality of inputting data can be implemented by time-division multiplexing many times or by arranging a plurality of identical delay chains.

At least one embodiment of the present disclosure provides a computing device, which can be configured for matrix multiplication operation, such as forward computing of neural network.

Figure 4:
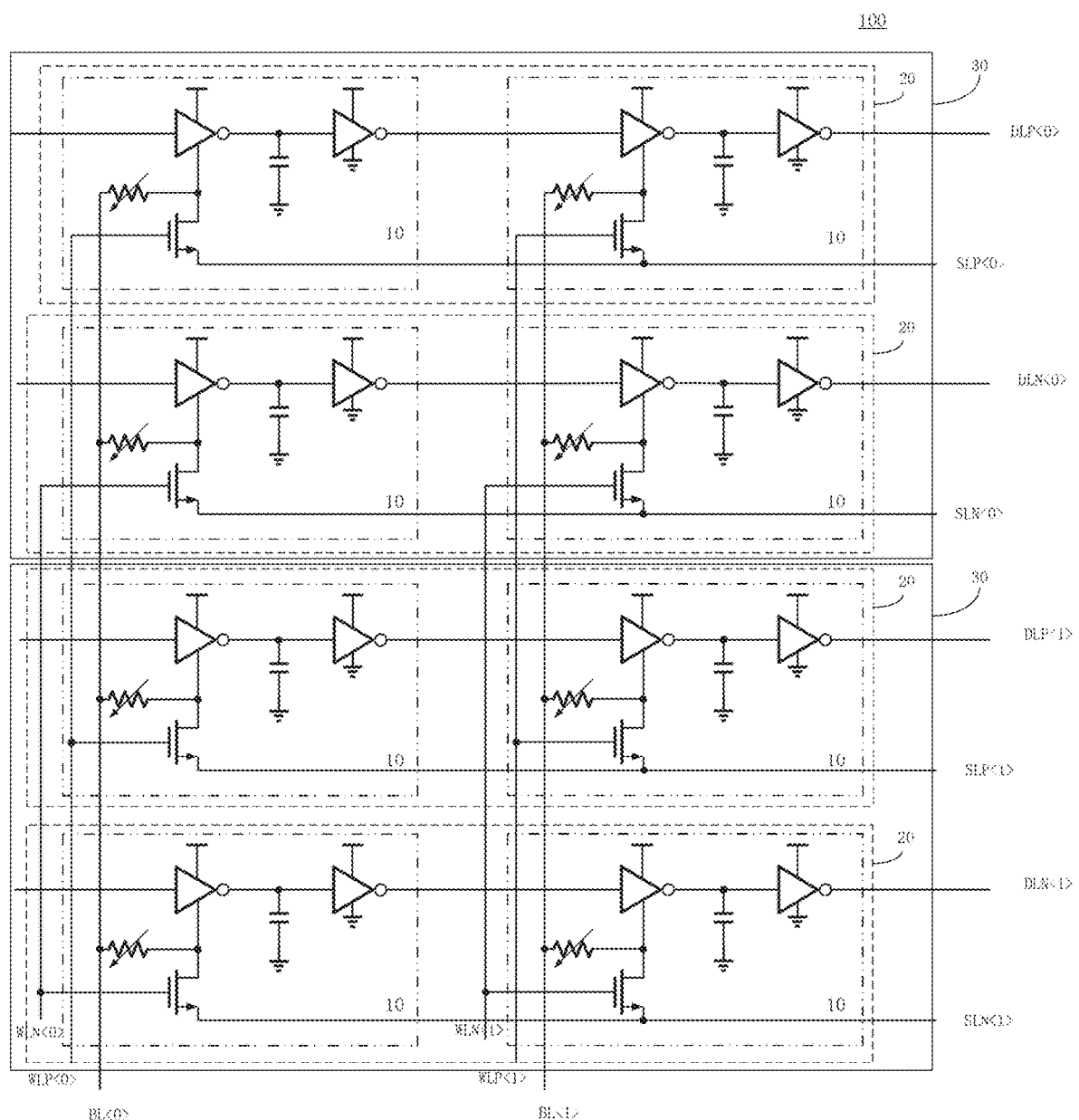
FIG. 4 is a structural schematic diagram of an exemplary delay computing array provided by at least one embodiment of the present disclosure.

As illustrated in FIG. 4, the computing device includes a delay computing array 100, and the delay computing array 100 includes 2M rows and N columns of delay buffer units 10 (only 4 rows and 2 columns are illustrated in the figure).

For example, N delay buffer units 10 in each of the 2M rows are connected in series to form a row of delay chain 20, and every two adjacent rows of delay chains 20 form a delay processing combination 30. The delay difference between two delay buffer units 10 in the same column in each delay processing combination 30 can correspond to a signed weight element, for example, by configuring the resistance values of the memristors in the two delay buffer units 10, the delay difference between the two delay buffer units 10 can represent a weight element with a positive value, a negative value, or a zero value. That is, the two delay buffer units 10 in the same column in each delay processing combination 30 can be configured as a differential unit, and the delay of each differential unit can be configured to represent a weight element with a positive value, a negative value, or a zero value.

For example, the two rows of delay chains 20 in each delay processing combination 30 receive the same input signal KEEP, for example, the input signal KEEP is respectively received through the input terminal INT of the first delay buffer unit 10 in the two rows of delay chains 20. The input signal KEEP may be configured to control the operating mode of the delay computing array 100. For example, the input signal KEEP can control whether the delay computing array 100 is in the first operating mode or the second operating mode. In the case where the input signal KEEP remains being normally low-level (or normally high-level), the delay computing array 100 is in the first operating mode; in the case where the input signal KEEP is the rising edge trigger signal (or the falling edge trigger signal), the delay computing array 100 is in the second operating mode.

In the first operating mode, the input signal KEEP is, for example, low-level, thereby controlling the delay adjustment sub-unit 11 in the delay buffer unit 10 to electrically disconnect from the first-stage inverter P1, at this time, the first processing operation mentioned-above can be performed on the memristor RRAM, such as the set operation, the reset operation and so on. In the second operating mode, the input signal KEEP feeds an edge signal, thereby controlling the delay adjustment sub-unit 11 in the delay buffer unit 10 to be electrically connected with the first-stage inverter P1, at this time, the computing operation or the calibration read operation can be performed on the delay computing array 100, for example, the delay computing result or delay read result can be obtained from the output terminal of the delay chain.

For example, each of the output terminals of the two rows of delay chains 20 in each delay processing combination 30 outputs the cumulative delay of the plurality of delay buffer units 10 in each row. For example, as illustrated in FIG. 4, the first row of delay chain 20 in the first delay processing combination 30 outputs the cumulative delay t_DLP<0> of the N delay buffer units 10 in the first row from the output terminal DLP<0>, the second row of delay chain 20 outputs the cumulative delay t_DLN<0> of the N delay buffer units 10 in the second row from the output terminal DLN<0>.

For example, in one example, in the case where a computing operation is performed on the delay computing array 100, the difference $\Delta T$, which is equal to t_DLP<0>–t_DLN<0>, between cumulative delays of the two rows of delay chains in the delay processing combination 30 can represent the vector inner product result of the inputting data and the signed weight elements.

For example, in another example, in the case where a calibration read operation is performed on the delay computing array 100, the delay of one differential unit in the delay processing combination 30 (the delay difference of two delay buffer units 10) can be read according to the difference $\Delta T$ between the cumulative delays of the two rows of delay chains in the delay processing combination 30. The differential unit can be calibrated by reading the delay of the differential unit, that is, whether the differential unit is programmed to an expected weight can be judged by reading the delay of the differential unit, in the case where the delay of the differential unit does not reach the expected value, the resistance value of the memristor can be adjusted again until the delay of the differential unit reaches the expected delay, thereby ensuring the accuracy of the computing.

For example, in another example, in the case where the intrinsic delays of the two rows of delay chains do not match with each other due to process reasons, another calibration read operation can be performed on the delay computing array 100, that is, the difference between the intrinsic delays of the two rows of delay chains can be read according to the difference $\Delta T$ between the cumulative delays of the two rows of delay chains in the delay processing combination 30. After reading the difference in the intrinsic delays of the two rows of delay chains, the calibration operation can be performed on the intrinsic delays of the two rows of delay chains, so that the intrinsic delays of the two rows of delay chains match with each other, thereby reducing computing errors caused by the process reasons. For example, the delay computing array 100 further includes 2N word lines corresponding to N columns of delay buffer units 10, N bit lines, and 2M source lines corresponding to 2M rows of delay buffer units. It should be noted that in the embodiments of the present disclosure, the directions of rows and columns are not limited to the situation in the figure, but can be determined as needed, the embodiments of the present disclosure are not limited thereto.

For example, two delay buffer units 10 located in the same column in each delay processing combination 30 are respectively connected with the two word lines corresponding to the same column. For example, as illustrated in FIG. 4, two adjacent delay buffer units 10 in the first column of the first row delay processing combination 30 are connected with the word line WLP<0> and the word line WLN<0> respectively.

For example, the two delay buffer units 10 in the same column of each delay processing combination 30 are connected with the bit line corresponding to the same column. For example, as illustrated in FIG. 4, two adjacent delay buffer units 10 in the first column of the first row of delay processing combination 30 are both connected with the bit line BL<0>.

For example, in each delay processing combination 30, N delay buffer units 10 located in the same row are connected with the source line of the same row. For example, in the first row of delay processing combination 30, the N delay buffer units 10 located in the first row are all connected with the source line SLP<0>, and the N delay buffer units 10 located in the second row are all connected with the source line SLN<0>.

For example, for the delay buffer unit 10 in the delay computing array 100, the delay adjustment sub-unit 11 of the delay buffer unit 10 is connected with the first terminal (for example, the source terminal) of the first-stage inverter, and the delay adjustment sub-unit 11 is connected with the source line corresponding to the row where the delay adjustment sub-unit is located, the bit line corresponding to the column where the delay adjustment sub-unit is located, and the word line corresponding to the column where the delay adjustment sub-unit is located, so as to be connected with different operating voltage terminals through the source line, the bit line, and the word line, such as the first operation voltage terminal or the second operating voltage terminal.

For example, as illustrated in FIG. 4, in the delay buffer unit 10 in the first row and in the first column, the control electrode of the control switch NM1 in the delay adjustment sub-unit 11 is connected with the word line WLP<0>, and the first electrode of the control switch NM1 is connected with the first terminal of the first-stage inverter P1 and the first terminal of the memristor RRAM, the second electrode of the control switch NM1 is connected with the source line SLP<0>, and the second terminal of the memristor is connected with the bit line BL<0>. The connection method of delay buffer units 10 in other rows and other columns to the word lines, the bit lines, and the source lines is similar, which will not be described again here.

The operating method of the computing device will be described below.

In at least one embodiment of the present disclosure, the operating method of the computing device includes: controlling at least one delay processing combination in the delay computing array through the 2N word lines according to a control signal combination, the control signal combination includes 2N first control signals that are respectively applied to the 2N word lines; applying corresponding input signals respectively to input terminals of the at least one delay processing combination, and receiving output signals obtained by delay processing the corresponding input signals at output terminals of the at least one delay processing combination.

For example, the operating method further includes: for each delay buffer unit in the delay processing combination, selecting an operation mode according to the corresponding input signals, and performing an operation corresponding to the operation mode according to the control signal combination.

As mentioned above, the input signal KEEP can control whether the delay computing array 100 is in the first operating mode or the second operating mode.

In the first operating mode, a bit line of a column where the delay buffer unit is located is connected with a first operating voltage terminal, and a source line of a row where the delay buffer unit is located is connected with a second operating voltage terminal, and a first processing operation is performed on a memristor in the delay buffer unit according to a first control signal corresponding to the delay buffer unit. The first operating voltage terminal may be, for example, a power supply terminal that provides the first processing operating voltage, and the second operating voltage terminal may be, for example, a ground terminal.

For example, in the case where the input signal KEEP received by the input terminal of two rows delay chains 20 of the delay processing combination 30 controls the delay adjustment sub-unit 11 in the delay buffer unit 10 to be disconnected electrically from the first-stage inverter P1, a first processing operation such as an initialization operation, a set operation, a reset operation, and a read operation can be performed on the memristor RRAM. It should be noted that in the first operating mode, the input signal KEEP remains being normally low-level or normally high-level, and no edge trigger signal (such as a rising edge trigger signal or a falling edge trigger signal) exists, so the inverter is not triggered to flip, and no delay exists in the delay chain.

Figure 5A:
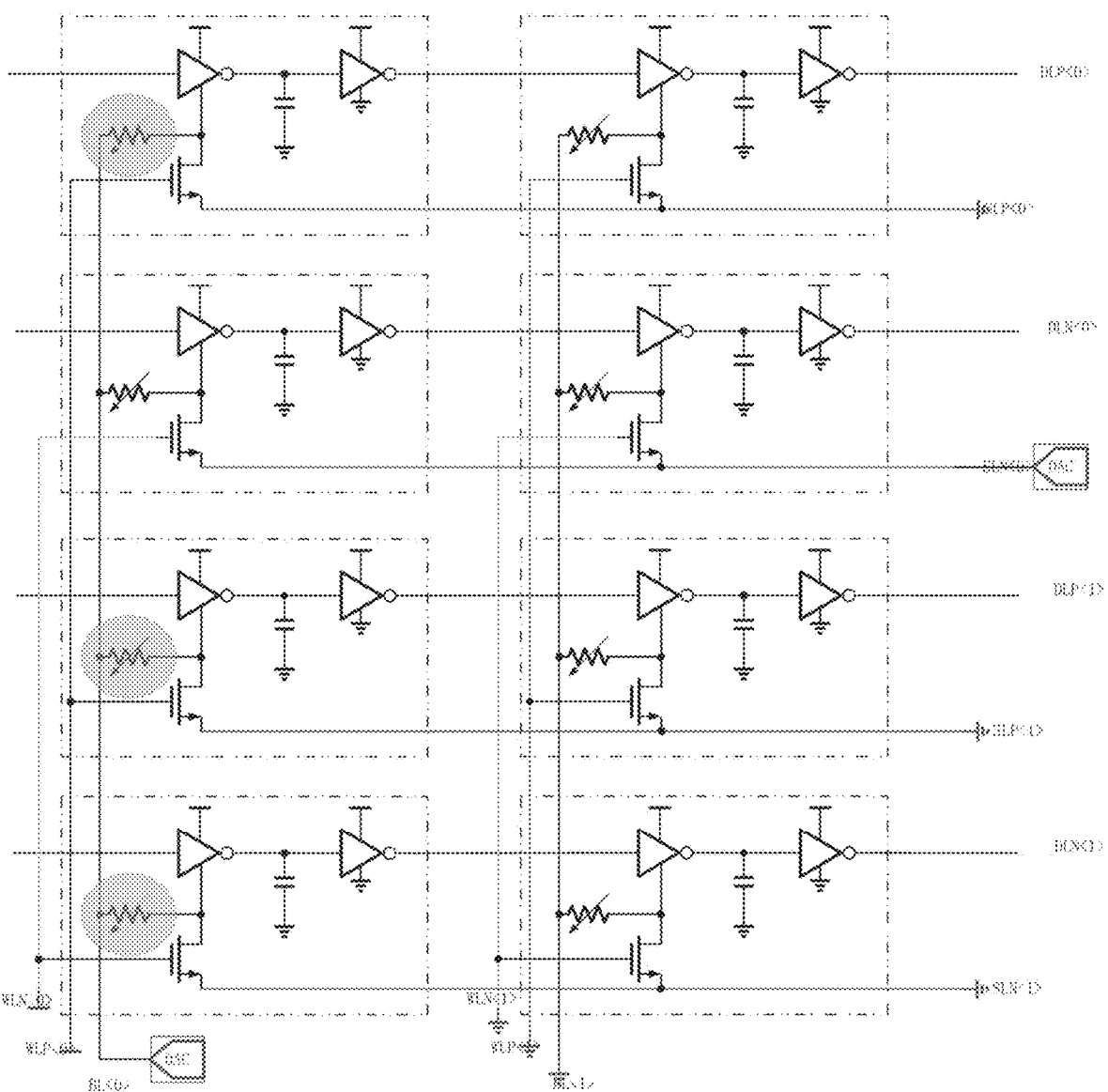
FIG. 5A is a schematic diagram of performing a set operation or an initialization operation on the delay computing array provided by at least one embodiment of the present disclosure.

FIG. 5A is a schematic diagram of performing a set operation or an initialization operation on the delay computing array provided by at least one embodiment of the present disclosure, the delay computing array is composed of, for example, the delay buffer unit illustrated in FIG. 1A. For example, in the case where performing a set operation or an initialization operation on the delay computing array 100, the input signal KEEP remains being low-level to disconnect the conductive path between the delay adjustment sub-unit and the first-stage inverter P1; a certain column in the delay computing array is selected by the word line WLN and the word line WLP, for example, the first column in the delay computing array is selected by the word line WLN<0> and the word line WLP<0>, thereby turning on the control switch NM1 of N delay buffer units 10 in the first column, and connecting the bit line BL<0> of the selected first column to the power supply terminal DAC (the bit lines of other unselected columns are all connected with ground); the target delay buffer unit is selected through the source line SLP and the source line SLN, so that a set operation or an initialization operation can be performed on the memristor in the target delay buffer unit, for example, as illustrated in FIG. 5A, a circled delay buffer unit is the target delay buffer unit, that is, the first delay buffer unit, the third delay buffer unit, and the fourth delay buffer unit in the first column are target delay buffer units, the source line SLP<0>, the source line SLP<1>, and the source line SLN<1> of the corresponding rows of these target delay buffer units are connected with ground, and the source lines of the remaining rows are connected with the power supply terminal DAC, thereby applying the set voltage SET or the initialization operation voltage FORM to the memristor in the target delay buffer unit, so that the resistance value of the memristor can be small.

Figure 5B:
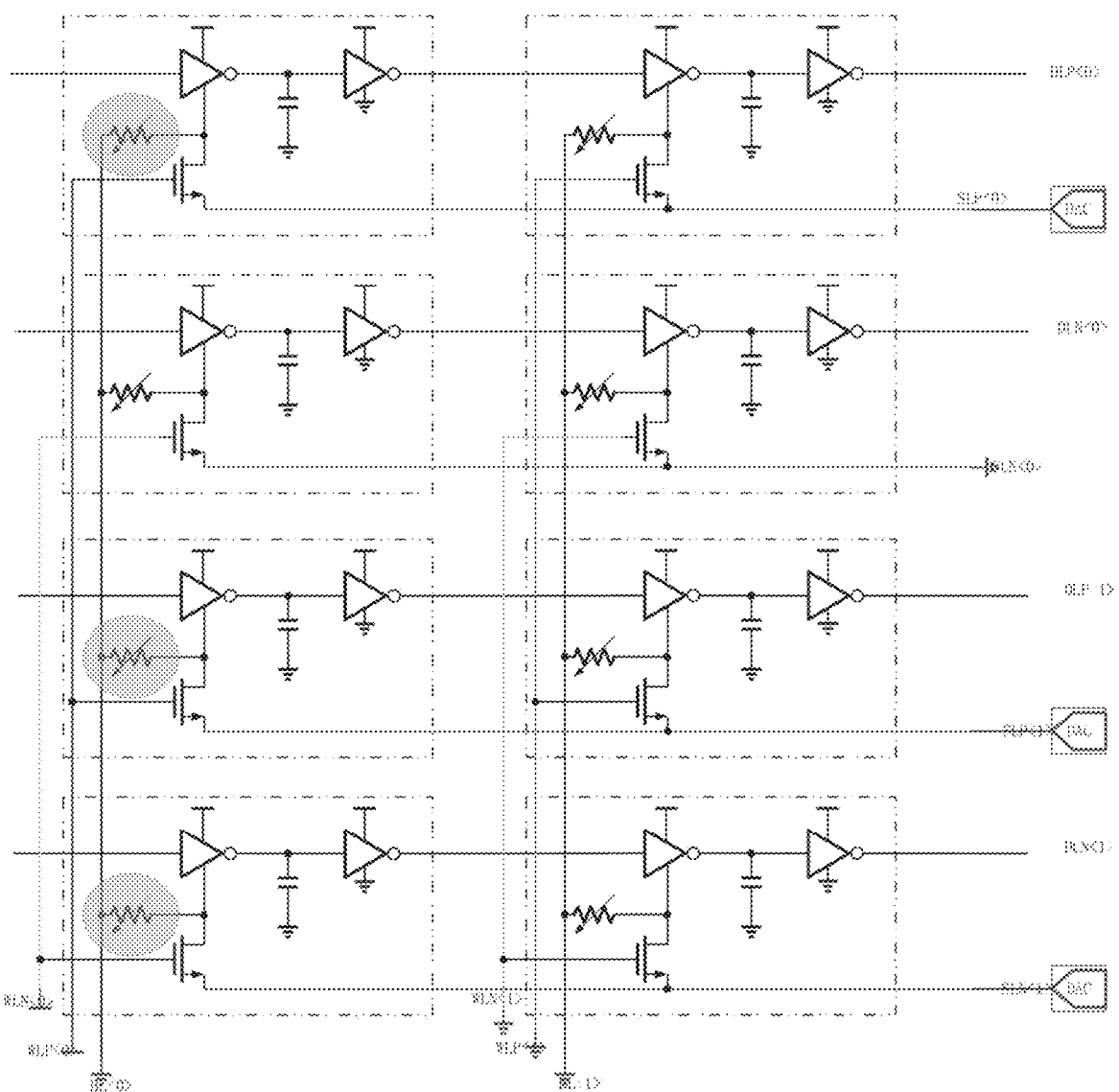
FIG. 5B is a schematic diagram of performing a reset operation on the delay computing array provided by at least one embodiment of the present disclosure.

FIG. 5B is a schematic diagram of performing a reset operation on the delay computing array provided by at least one embodiment of the present disclosure. For example, in the case where a reset operation is performed on the delay computing array 100, the input signal KEEP remains being low-level to disconnect the conductive path between the delay adjustment sub-unit and the first-stage inverter P1; a certain column in the delay computing array is selected through the word line WLN and the word line WLP, for example, the first column in the delay computing array is selected through the word line WLN<0> and the word line WLP<0>, thereby turning on the control switch NM1 of the N delay buffer units 10 in the first column, and connecting the bit line BL<0> of the selected first column to ground (the bit lines of other unselected columns are connected with the power supply terminal DAC); the target delay buffer unit is selected through the source line SLP and the source line SLN to perform the reset operation on the memristor in the target delay buffer unit, for example, as illustrated in FIG. 5B, a circled delay buffer unit is the target delay buffer unit, that is, the first delay buffer unit, the third delay buffer unit and the fourth delay buffer unit in the first row are target delay buffer units, the source line SLP<0>, the source line SLP<1>, and the source line SLN<1> of the corresponding rows of these target delay buffer units are connected with the power supply DAC, the source lines of the other rows are connected with ground, thereby applying a reset voltage RESET to the memristor in the target delay buffer unit, so that the resistance value of the memristor can be large.

The reading operation of the memristor is similar to the above process and will not be described again here. It should be noted that the initialization operation of the memristor only needs to be performed once, and the set operation or the reset operation of the memristor can be performed a plurality of times to adjust (program) the resistance value of the memristor. For example, after performing the set operation or the reset operation on the memristor, in traditional practice, the memristor can further be read to verify whether the resistance value of the memristor reaches an expected resistance value, in the case where the resistance value of the memristor does not reach the expected resistance value, the memristor can be set or reset again until the resistance value of the memristor reaches the expected resistance value.

In the second operating mode, the bit line of the column where the delay buffer unit is located and the source line of the row where the delay buffer unit is located are connected with the first operating voltage terminal, and a computing operation or a calibration read operation are performed on at least one delay processing combination according to the control signal combination. The first operating voltage terminal may be, for example, a ground terminal.

For example, in the case where the input signal KEEP received by the input terminal of the two row delay chains 20 of the delay processing combination 30 controls the delay adjustment sub-unit to be electrically connected with the first-stage inverter P1 in the delay buffer unit 10, and output signals with a certain cumulative delay (such as t_DLP<0> or t_DLN<0>) relative to the input signal can be obtained from the output terminals of the two rows of delay chains 20 respectively, the cumulative delay of the output signal can be, for example, the delay after adjusted by the memristor, therefore, the difference ΔT between the cumulative delays of two adjacent rows of delay chains 20 is equal to the difference of the delays adjusted by the memristors of the two adjacent rows.

In the second operating mode, a computing operation or a calibration read operation can be performed on the delay computing array 100, so that a delay computing result or a delay read result can be obtained from the output terminal of the delay chain, for example, the delay computing array 100 illustrated in FIG. 4 can obtain a differential delay computing result or a differential delay read result from the output terminal of the delay processing combination 30.

For example, in at least one example of the embodiment of the present disclosure, performing the computing operation on at least one delay processing combination selected according to the control signal combination, a specific example may include: applying 2N first control signals as computing input signals to 2N delay buffer units in the at least one delay processing combination through the 2N word lines; and obtaining a differential delay computing result from an output terminal of the at least one delay processing combination.

For example, in the case where performing the computing operation on the delay computing array 100, the input signal KEEP of the rising edge trigger signal is input to at least one delay processing combination 30 to turn on the conductive path between the delay adjustment sub-unit and the first-stage inverter P1; the N bit lines BL, the 2N source lines SLP and source lines SLN where the 2N delay buffer units are located in the two rows of delay chains in at least one delay processing combination 30 are connected with ground; 2N first control signals are applied as the computing input signals on the 2N delay buffer units in the two rows of delay chains in at least one delay processing combination 30 through the 2N word lines WLN and word lines WLP.

In the case where all the first control signals are low-level (corresponding to the inputting element V1 being 1), the memristors RRAM in the 2N delay buffer units are connected between the first-stage inverter P1 and the first operating voltage terminal 1, at this time, the cumulative delay of N delay buffer units in each row of delay chain is t1+t2+...+tN (t1, t2, ..., tn are the delays of N delay buffer units respectively). For example, the cumulative delay of the first row of delay chain in each delay processing combination is T1, and the cumulative delay of the second row of delay chain is T2, then the differential delay computing result ΔT obtained from the output terminal of the delay processing combination 30 is equal to T1−T2. In the case where all the first control signals are high-level (corresponding to the inputting element V1 being 0), the memristor RRAM is bypassed, and the memristors RRAM in the 2N delay buffer units are not connected between the first-stage inverter P1 and the first operating voltage terminal 1, at this time, the cumulative delay of the N delay buffer units in each row of delay chain is the sum of the intrinsic delays of the N delay buffer units, in the case where the intrinsic delays of the two rows of delay chains are equal, the differential delay computing result ΔT obtained from the output terminal of the delay processing combination 30 is equal to 0. In at least one example of the embodiment of the present disclosure, the computing operation can be performed on a plurality of delay processing combinations at the same time, thereby improving the computing efficiency while ensuring high accuracy, and avoiding the IR voltage drop problem of line resistance during computing, the matrix operation scale can be enlarged to a large extent, thus realizing large-scale and high-precision matrix operation.

For example, in at least one example of the embodiment of the present disclosure, performing a calibration read operation on at least one delay processing combination selected according to the control signal combination, a specific example thereof may include: determining a target column in the at least one delay processing combination for performing the calibration read operation; applying a first control signal for accessing the memristor and a first control signal for bypassing the memristor respectively to two delay buffer units in the target column in the at least one delay processing combination; applying a first control signal for bypassing the memristor to a plurality of columns other than the target column in the at least one delay processing combination; and obtaining a differential delay read result at the output terminal of the at least one delay processing combination.

Figure 6:
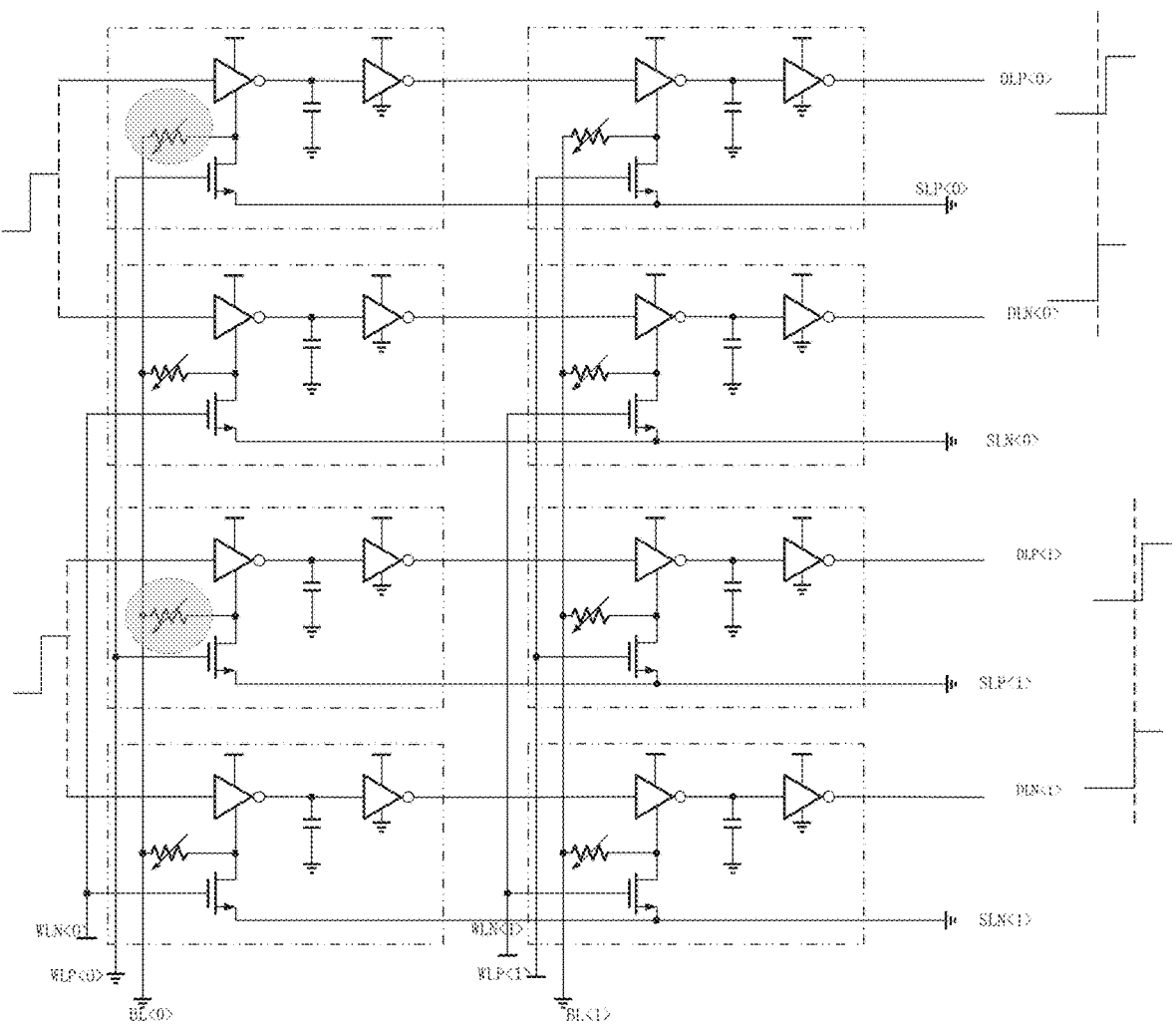
FIG. 6 is a schematic diagram of performing a calibration read operation on the delay computing array provided by at least one embodiment of the present disclosure.

FIG. 6 is a schematic diagram of performing a calibration read operation on the delay computing array provided by at least one embodiment of the present disclosure. The calibration read operation can be configured to read the delay difference of two adjacent delay buffer units 10 (differential units) in the same column in the delay processing combination 30, and verify whether a signed weight represented by the delay difference between the two delay buffer units 10 (differential units) is programmed to the expected weight.

As illustrated in FIG. 6, for example, taking the delay difference of two adjacent delay buffer units representing a signed weight in the first column as an example, the delay buffer units in the odd-numbered row of the first column are applied with a low-level first control signal through the word line WLP<0>, the delay buffer units in the even-numbered row of the first column are applied with a high-level first control signal through the word line WLN<0>, and the word lines WLP and the word lines WLN in other columns are applied with high-level first control signals, so that the delay difference of two delay buffer units in the first column of each delay processing combination 30 can be obtained from the DLP and DLN at the output terminal of each delay processing combination 30, that is, the differential delay read result, thereby achieving efficient parallel read and verification operations.

For example, after reading the differential delay read result of two adjacent delay buffer units, whether to perform the first processing operation on at least one memristor of the two delay buffer units in the target column can further be determined based on the differential delay read result. For example, in the case where the differential delay read result does not reach the expected weight value, the first processing operation can be performed again on at least one memristor of the two delay buffer units, for example, a set operation or a reset operation can be performed on one of the memristors again to increase or decrease the resistance value of the memristor, thereby adjusting the delay of the delay buffer unit where the memristor is located, so that the delay difference of the two delay buffer units is adjusted to the corresponding expected weight value. Therefore, the verification read operation on the delay computing array provided by at least one embodiment of the present disclosure can accurately represent the expected weight value by the delay of the differential unit, thereby effectively improving the accuracy of the calculation.

For example, in at least one example of the embodiment of the present disclosure, a calibration read operation is performed on at least one selected delay processing combination according to the control signal combination, a specific example may include: determining at least one delay processing combination for performing the calibration read operation; applying a first control signal for bypassing the memristor to a plurality of delay buffer units in at least one delay processing combination; and obtaining a differential delay read result at the output terminal of the at least one delay processing combination.

After the delay computing array 100 is prepared, due to process reasons, the intrinsic delays of the two rows of delay chains in each delay combination may have a large mis-match, and in the case where the mismatch of the intrinsic delays of the two rows of delay chains is large, the accuracy of the calculation will be seriously affected. Therefore, at least one embodiment of the present disclosure further provides a calibration read operation, through which the difference (mismatch) of the intrinsic delays of the two rows of delay chains in the delay processing combination can be read, and thus the difference (mismatch) can be eliminated through the intrinsic delay calibration module provided by the present disclosure.

As illustrated in FIG. 6, for example, taking that the two rows of delay chains in the first delay processing combina-tion are read as an example, the m delay buffer units in the first row of delay chains are applied with high-level first control signals through the word line WLP<0>, the word line WLP<1>, . . . , and the word line WLP<M>, the m delay buffer units in the second row of delay chains are also applied with high-level first control signals through the word line WLN<0>, the word line WLN<1>, . . . , and the word line WLN<M>, that is, the memristor in each delay buffer unit is bypassed, and the delay controlled by the memristor is not serially inserted into in the delay chain. At this time, the cumulative delay outputted from the output terminals of the two row delay chains only includes the intrinsic delays of the inverter, and the differential delay read result obtained from the output terminal of the delay processing combina-tion is the mismatch of the intrinsic delays of the two row delay chains. Subsequent calibration operations based on the differential delay read result can make the intrinsic delays of the two rows of delay chains equal, thereby helping to improve the accuracy of the calculation.

In the embodiment of the present disclosure, the differ-ential delay computing result or the differential delay read result obtained from the output terminal of at least one delay processing combination is a computing result in the time domain, therefore, it is needed to convert the computing result into analog signals (time-delay charge conversion (TQC) process), and the analog signals are further converted into digital signals for subsequent data processing.

The computing device provided by at least one embodi-ment of the present disclosure further includes at least one delay charge conversion module and at least one analog-to-digital conversion module. At least one delay charge con-version module is connected with the delay processing combination, and is configured to quantify a delay difference of output signals of the two rows of delay chains in the delay processing combination into a voltage output signal. The at least one analog-to-digital conversion module is connected with the delay charge conversion module, and is configured to convert the voltage output signal outputted from the delay charge conversion module into a digital signal.

Because the TQC process of converting the delay into charge is time-consuming, and the analog-to-digital conver-sion process takes a short time, a plurality of delay charge conversion modules can share one analog-to-digital conver-sion module, for example, in at least one example of the embodiment of the present disclosure, the computing device may include a plurality of delay charge conversion modules, and the plurality of delay charge conversion modules are connected with one analog-to-digital conversion module to time-division multiplex the analog-to-digital conversion module, thereby improving conversion efficiency.

Figure 7:
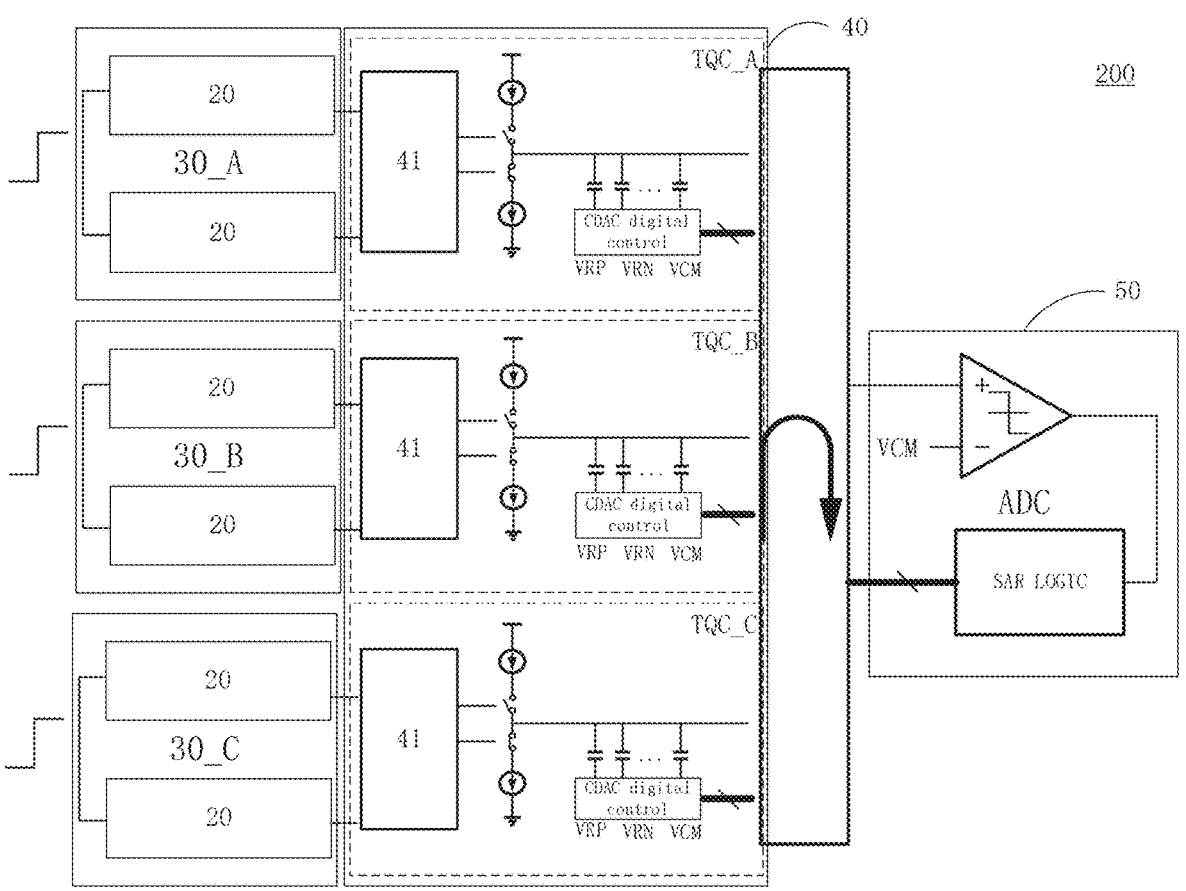
FIG. 7 is a structural schematic diagram of a computing device provided by at least one embodiment of the present disclosure.

For example, the computing device 200 illustrated in FIG. 7 includes a delay computing array 100, a delay charge conversion module 40, and an analog-to-digital conversion module 50. The figure takes that illustrating three delay processing combinations 30_A, 30_B and 30_C as an example, each delay charge conversion module 40 is con-nected with the output terminal of one delay processing combination 30 of the delay computing array, for example, a delay charge conversion module TQC_A is connected with the delay processing combination 30_A, a delay charge conversion module TQC_B is connected with the delay processing combination 30_B, and a delay charge conver-sion module TQC_C is connected with the delay processing combination 30_C, so that the delay difference between the output signals of the two rows of delay chains 20 of the corresponding delay processing combination 30 is quantized into a voltage output signal.

For example, the delay charge conversion module 40 includes a current mirror, a current mirror control logic 41 and a capacitive digital-to-analog conversion (CDAC) and corresponding digital control switches.

For example, during the TQC process, the delay charge conversion module 40 uses a low-power current mirror control logic 41 to ensure the timely startup of the current mirror, thereby controlling the CDAC to perform passive integration through the current mirror, and then quantifying the delay difference produced by the delay processing com-bination 30.

Figure 8:
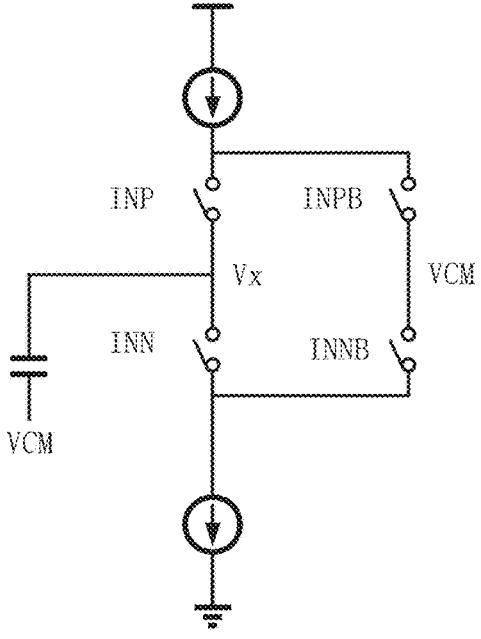
FIG. 8 is a structural schematic diagram of an exemplary current mirror control unit provided by at least one embodiment of the present disclosure.
Figure 9:
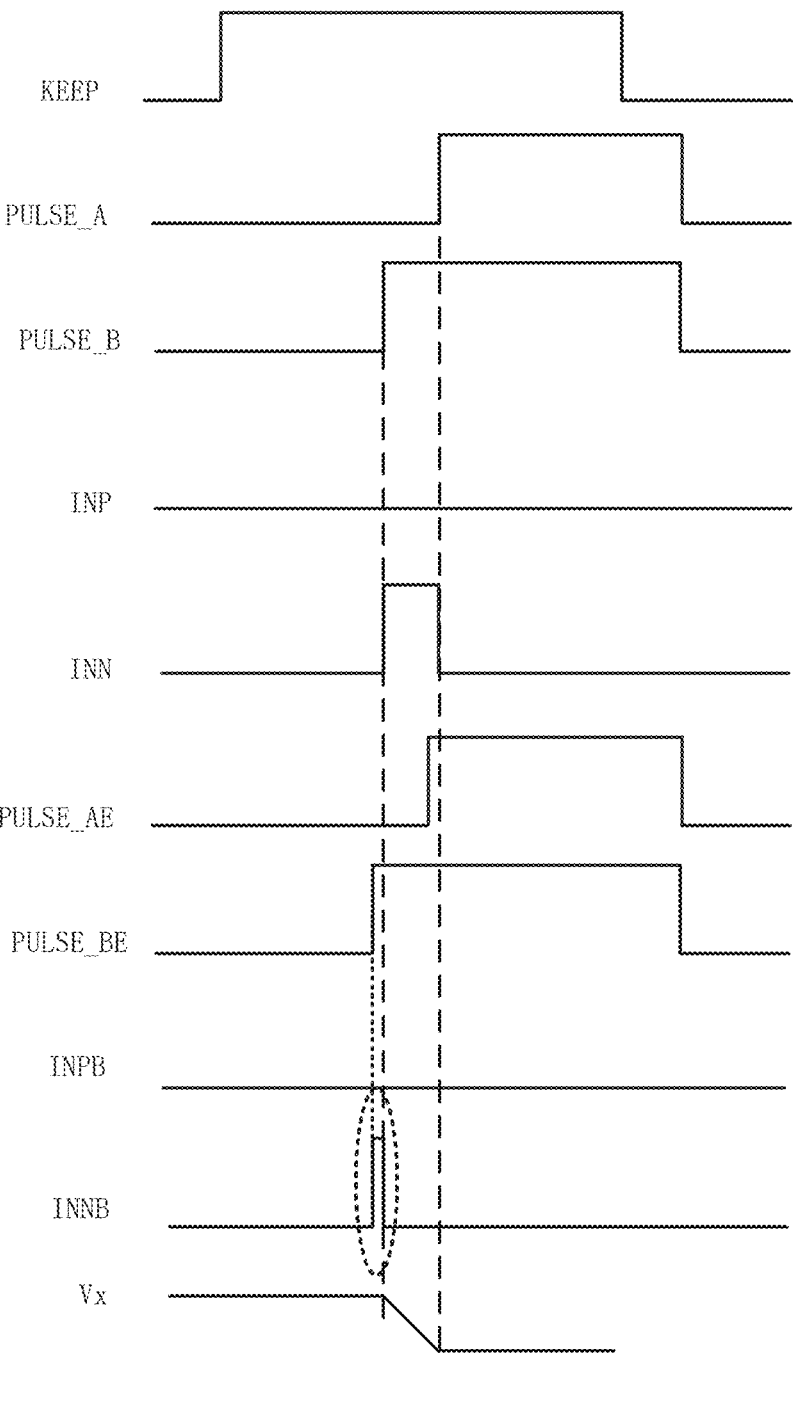
FIG. 9 is a timing diagram of a delay charge conversion process provided by at least one embodiment of the present disclosure.

FIG. 8 is a structural schematic diagram of an exemplary current mirror control unit provided by at least one embodi-ment of the present disclosure; FIG. 9 is a timing diagram of a delay charge conversion process provided by at least one embodiment of the present disclosure. The following is a brief description of the TQC process in conjunction with FIG. 8 and FIG. 9.

For example, KEEP represents a rising edge trigger signal provided at the input terminal INT of the delay processing combination 30, after the rising edge of the KEEP signal triggers the computing operation, the first row of the delay chain (positive difference row) and the second row of delay chain (negative differential row) in the delay processing combination 30 generate a rising edge PULSE_A output signal and a rising edge PULSE_B output signal respec-tively after a certain period of time. For example, it is needed to generate an early rising edge signal PULSE_AE and an early rising edge signal PULSE_BE corresponding to the output signal PULSE_A and the output signal PULSE_B respectively before the output signal PULSE_A and the output signal PULSE_B, which is configured for subse-quently the current source to start in advance to generate the control signal INPB and the control signal INNB. As illus-trated in FIG. 9, an integration control signal INP and an integration control signal INN are generated during the interval time between the rising edge of the output signal PULSE_A and the rising edge of the output signal PULSE_B, during this time period, the integration point Vx illustrated in FIG. 8 starts to integrate. Outside this time period, the integral control signal INP and the integral control signal INN are not turned on to avoid internal dissipation of the current mirror. For example, the output signal INNB is generated during the interval time between the output signal PULSE_B and the early rising edge signal PULSE_BE to start to pull down the current mirror in advance, thereby ensuring that the current is relatively accurate during actual integration.

For example, in at least one embodiment of the present disclosure, in order to avoid mismatch between the positive current mirror and the negative current mirror, a self-zeroing process of the current can further be added, this process can be performed every several KEEP cycles, for example, during a low-level period of KEEP to avoid additional time overhead.

Figure 10:
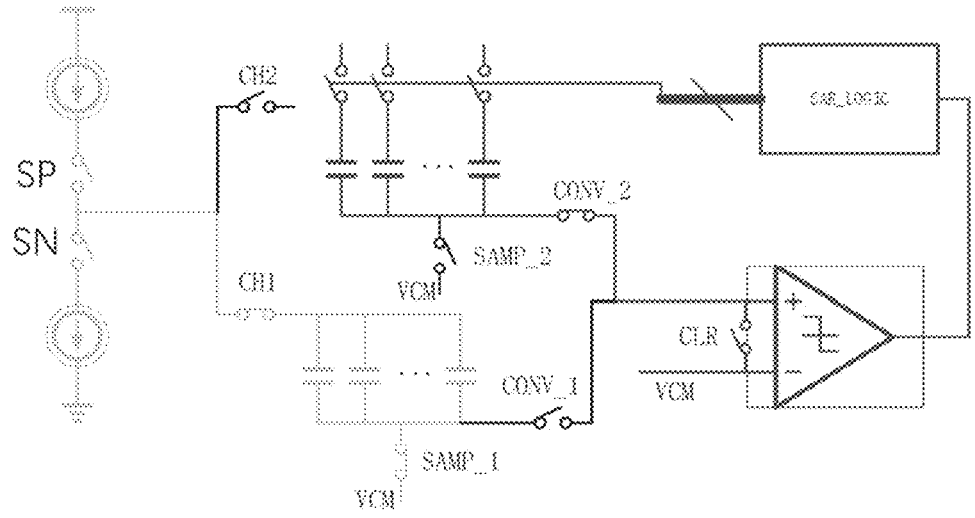
FIG. 10 is a structural schematic diagram of an exemplary quantization circuit provided by at least one embodiment of the present disclosure.
Figure 11:
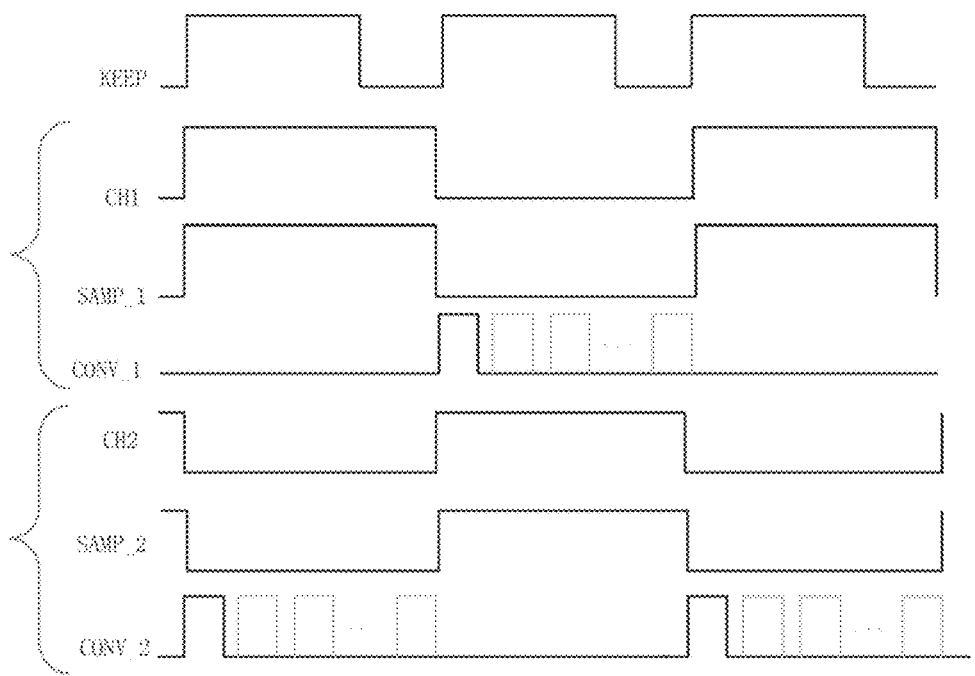
FIG. 11 is a timing diagram of a forward computing process provided by at least one embodiment of the present disclosure.

FIG. 10 is a structural schematic diagram of an exemplary quantization circuit provided by at least one embodiment of the present disclosure; FIG. 11 is a timing diagram of a forward computing process provided by at least one embodiment of the present disclosure; the sampling quantization process of the two rows of delay chains in the delay processing combination is briefly explained below by combining FIG. 10 and FIG. 11.

For example, as illustrated in FIG. 10, the rising edge output signals of two adjacent rows of delay chains (for example, positive differential row and negative differential row) in a delay processing combination 30 are respectively connected with the control switch SP or the control switch SN of the current source or the current sink. The delay difference between the rising edge output signals of two adjacent rows of delay chains determines the integration time in the CDAC. That is, within a KEEP cycle, a channel CH1 is in a sampling state, the top plate of the capacitor of the channel CH1 passes the current integration (CH1=1), the bottom plate of the capacitor is connected with the VCM (SAMP_1=1), and the TQC is in a fully parallel state. After completing the TQC quantization process, the integration voltage on the capacitor (voltage output signal in the embodiment of the present disclosure) is ADC quantized in the next cycle of the KEEP period signal, thereby obtaining a digital outputting. As illustrated in FIG. 11, in the next KEEP period, the integration voltage of the channel CH1 is quantized sequentially among a plurality of differential rows through the ADC (CONV_1=1), while the channel CH2 is in a fully parallel sampling state. In this way, the sampling process and the quantization process are alternately performed, thereby improving the throughput of the system.

Figure 12:
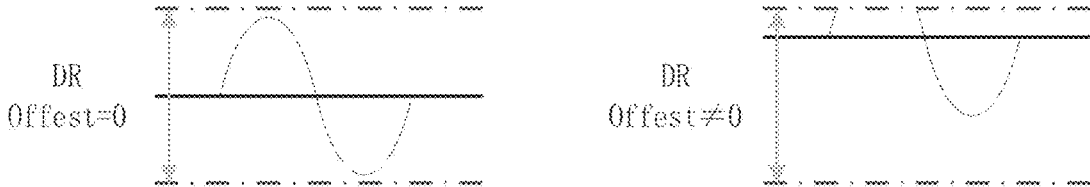
FIG. 12 illustrates a schematic diagram of an erosion of an ADC dynamic range by deviation and mismatch of intrinsic delay between two adjacent rows of delay chains.

It should be noted that because a plurality of inverters are in one row of delay chains, affected by process deviations, even the intrinsic delays of two rows of delay chains in the same delay processing combination may have large difference, and the difference between the intrinsic delays will introduce a large offset. As illustrated in the simulation results in FIG. 12, in the case where 128 delay buffer units are connected in series, the standard deviation of the distribution of the intrinsic delay difference of the delay chain reaches ~3 n, which can be comparable to the quantization range of the subsequent delay charge conversion process TQC and the analog-to-digital conversion process ADC, which will seriously consume the dynamic range of the ADC.

Figure 13:
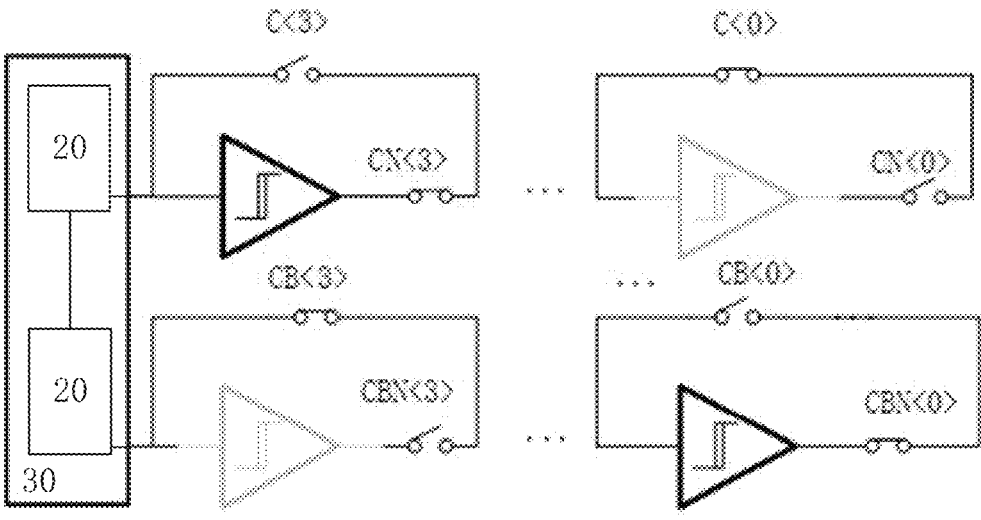
FIG. 13 is a structural schematic diagram of an exemplary intrinsic delay calibration module provided by at least one embodiment of the present disclosure.

Therefore, the computing device provided by at least one embodiment of the present disclosure may further include an intrinsic delay calibration module, the intrinsic delay calibration module is connected with the delay processing combination 30 and is configured to calibrate the intrinsic delays of the two rows of delay chains 20, so that the intrinsic delays of the two rows of delay chains match with each other. As illustrated in FIG. 13, the intrinsic delay calibration module may include a plurality of delay calibration units CB. For example, before performing computing, by applying a first control signal corresponding to a high-level inputting of 0 to all delay buffer units in the delay computing array, the total delay of a row of delay chain can be read, and the total delay at this time is consists only of intrinsic delays and does not include delays adjusted by the memristor. According to the comparison result of the total intrinsic delay of the two rows of delay chains which has been read, the additionally introduced delay calibration unit CB can be selectively connected or bypassed, thereby adjusting the intrinsic delays of the two rows delay chains for the same length of time to avoid process deviations from eroding the dynamic range of the ADC.

For example, eight delay processing combinations with a length of 128 bit (the number of delay buffer units in one row of delay chain) share an ADC can be taken as an example to simulate and calculate the power consumption, energy efficiency and computing power of the system.

For example, in the case where the period of a KEEP is 250 n, the power consumption of the delay computing array is $0.5C*V^2*$ #=$0.5*2$ f*$0.45^2*8*128*2/250$ n (in order to avoid interference during forward computing, VDD is set at 0.45), the delay computing array consumes about ¼ of the power consumption of the entire system (system circuit level simulation results). For example, in the case where 128*8 1b_in-signed 3b_weight-8b_out operations are completed in a KEEP cycle, the energy efficiency of the system is 128*8/ 250 n/($0.5*2$ f*$0.45^2*8*128*2*4/250$ n), which is about 1230 TOPS/W (accuracy prerequisite 1-s_3-8, 128 accumulation). For example, the computing power achieved by the above group of units (8 delay processing combinations with a length of 128 bit) is 128*8/250 n~4.1 GOPS (8*128*2=2 k), which increases proportionally as the scale of the array increases. Compared with the ISSCC in recent years, the computing device provided by the embodiments of the present disclosure can achieve higher computing power with the same unit capacity.

The above simulation results prove that the computing device and the operating method thereof provided by at least one embodiment of the present disclosure can implement large-scale matrix operations with high precision and low energy consumption, and can improve the computing efficiency of matrix-vector multiplication calculation.

Although the present disclosure has been described in detail above with general descriptions and specific implementations, it is obvious to those skilled in the art that some modifications or improvements can be made based on the embodiments of the present disclosure, therefore, these modifications or improvements made without departing from the spirit of the present disclosure shall fall within the scope of protection claimed by the present disclosure.

For the present disclosure, the following points need to be explained:

(1) The drawings of the embodiment of this disclosure only relate to the structure related to the embodiment of the present disclosure, and other structures can refer to the general design.

(2) For the sake of clarity, in the drawings used to describe the embodiments of the present disclosure, the thickness of layers or regions is enlarged or reduced, that is, these drawings are not drawn to actual scale.

(3) In the case of no conflict, the embodiments of the present disclosure and the features in the embodiments can be combined with each other to obtain a new embodiment.

The above is only the specific implementation of this disclosure, but the scope of protection of this disclosure is not limited to this, and the scope of protection of this disclosure should be subject to the scope of protection of the claims.

The invention claimed is:

1. A delay buffer unit, comprising: a first-stage inverter, a second-stage inverter and a delay adjustment sub-unit, wherein an input terminal of the first-stage inverter serves as an input terminal of the delay buffer unit;

an input terminal of the second-stage inverter is connected with an output terminal of the first-stage inverter, and an output terminal of the second-stage inverter serves as an output terminal of the delay buffer unit;

the delay adjustment sub-unit is connected between a first terminal of the first-stage inverter and a first operating voltage terminal, and the delay adjustment sub-unit comprises a memristor and is configured to adjust a transmission delay of the first-stage inverter by controlling and using the memristor according to a first control signal.

2. The delay buffer unit according to claim 1, wherein the delay adjustment sub-unit further comprises a control switch, the control switch comprises a first electrode, a second electrode and a control electrode, the control electrode receives the first control signal to conduct or cut off the first electrode and the second electrode according to the first control signal, the first electrode of the control switch is electrically connected with the first terminal of the first-stage inverter;

a first terminal of the memristor is electrically connected with the first electrode of the control switch and the first terminal of the first-stage inverter, and a second terminal of the memristor is electrically connected with the first operating voltage terminal.

3. The delay buffer unit according to claim 2, wherein the second electrode of the control switch is electrically connected with the first operating voltage terminal, or with a second operating voltage terminal that is different from the first operating voltage terminal.

4. An operating method of the delay buffer unit according to claim 1, comprising:

receiving an input signal of the delay buffer unit at the input terminal of the first-stage inverter, and outputting an output signal of the delay buffer unit at the output terminal of the second-stage inverter; and receiving the first control signal by the delay adjustment sub-unit, and adjusting the transmission delay of the first-stage inverter by controlling and using the memristor according to the first control signal.

5. The operating method according to claim 4, wherein the delay adjustment sub-unit further comprises a control switch, the control switch comprises a first electrode, a second electrode and a control electrode, and a first terminal of the memristor is electrically connected with the first electrode of the control switch, the receiving the first control signal by the delay adjustment sub-unit, and adjusting the transmission delay of the first-stage inverter by controlling and using the memristor according to the first control signal, comprises:

controlling whether to access the memristor between the first terminal of the first-stage inverter and the first operating voltage terminal by the control switch according to the first control signal; and changing a source degeneracy resistance of the first-stage inverter based on the input signal by using the memristor to adjust the transmission delay of the first-stage inverter.

6. The operating method according to claim 5, wherein in a case where the memristor is accessed between the first terminal of the first-stage inverter and the first operating voltage terminal according to the first control signal, the transmission delay of the first-stage inverter is a transmission delay adjusted by the memristor; and in a case where the memristor is bypassed between the first terminal of the first-stage inverter and the first operating voltage terminal according to the first control signal, the transmission delay of the first-stage inverter is an intrinsic delay of the first-stage inverter.

7. The operating method according to claim 4, further comprising:

disconnecting a conductive path between the delay adjustment sub-unit and the first-stage inverter according to the input signal; and connecting the delay adjustment sub-unit with the first operating voltage terminal and a second operating voltage terminal to perform a first processing operation on the memristor according to the first control signal.

8. The operating method according to claim 7, wherein the delay adjustment sub-unit further comprises a control switch, the control switch comprises a first electrode, a second electrode and a control electrode, and a first terminal of the memristor is electrically connected with the first electrode of the control switch, the connecting the delay adjustment sub-unit with the first operating voltage terminal and a second operating voltage terminal to perform a first processing operation on the memristor according to the first control signal, comprises:

connecting the second electrode of the control switch with the first operating voltage terminal, and connecting a second terminal of the memristor with the second operating voltage terminal;

turning on the control switch according to the first control signal to adjust a resistance value of the memristor by a first processing operating voltage between the first operating voltage terminal and the second operating voltage terminal.

9. The operating method according to claim 7, wherein the first processing operation comprises a set operation, a reset operation, a read operation or an initialization operation.

10. A computing device, comprising:

a delay computing array, comprising 2M rows and N columns of delay buffer units, 2N word lines corresponding to the N columns, N bit lines corresponding to the N columns, and 2M source lines corresponding to the 2M rows, wherein N delay buffer units in each of the 2M rows are connected in series to form a row of delay chain, each two adjacent rows of delay chains constitute a delay processing combination, two rows of delay chains in each delay processing combination receive a same input signal;

two delay buffer units located in a same column in each delay processing combination are respectively connected with two word lines corresponding to the same column;

each of the delay buffer units comprises a first-stage inverter, a second-stage inverter and a delay adjustment sub-unit, an input terminal of the first-stage inverter serves as an input terminal of the delay buffer unit, an input terminal of the second-stage inverter is connected with an output terminal of the first-stage inverter, and an output terminal of the second-stage inverter serves as an output terminal of the delay buffer unit, the delay adjustment sub-unit is connected with a first terminal of the first-stage inverter, and is connected with a source line corresponding to a row where the delay adjustment sub-unit is located, a bit line corresponding to a column where the delay adjustment sub-unit is located, and a word line corresponding to the column where the delay adjustment sub-unit is located, the delay adjustment sub-unit comprises a memristor, and is configured to adjust a transmission delay of the first-stage inverter by controlling and using the memristor according to a first control signal provided by a corresponding word line.

11. The computing device according to claim 10, wherein the delay adjustment sub-unit further comprises a control switch, the control switch comprises a first electrode, a second electrode and a control electrode, the control electrode of the control switch is connected with the word line corresponding to the column where the delay adjustment sub-unit is located, the first electrode of the control switch is connected with the first terminal of the first-stage inverter and a first terminal of the memristor, and the second electrode of the control switch is connected with the source line corresponding to the row where the delay adjustment sub-unit is located, wherein a second terminal of the memristor is connected with the bit line corresponding to the column where the delay adjustment sub-unit is located.

12. The computing device according to claim 10, further comprising:

at least one delay charge conversion module, connected with the delay processing combination, and configured to quantify a delay difference of output signals of the two rows of delay chains in the delay processing combination into a voltage output signal;

at least one analog-to-digital conversion module, connected with the delay charge conversion module, and configured to convert the voltage output signal outputted from the delay charge conversion module into a digital signal.

13. The computing device according to claim 12, wherein the computing device comprises a plurality of delay charge conversion modules, the plurality of delay charge conversion modules are connected with one analog-to-digital conversion module to time-division multiplex the analog-to-digital conversion module.

14. The computing device according to claim 10, further comprising:

an intrinsic delay calibration module, connected with the delay processing combination, and configured to calibrate intrinsic delays of the two rows of delay chains so that the intrinsic delays of the two rows of delay chains match with each other.

15. An operating method of a computing device according to claim 10, comprising:

controlling at least one delay processing combination in the delay computing array through the 2N word lines according to a control signal combination, wherein the control signal combination comprises 2N first control signals that are respectively applied to the 2N word lines;

applying corresponding input signals respectively to input terminals of the at least one delay processing combination, and receiving output signals obtained by delay processing the corresponding input signals at output terminals of the at least one delay processing combination.

16. The operating method according to claim 15, further comprising:

for each delay buffer unit in the delay processing combination, selecting an operation mode according to the corresponding input signals, and performing an operation corresponding to the operation mode according to the control signal combination.

17. The operating method according to claim 16, wherein the operating mode comprises a first operating mode and a second operating mode, and the operating method further comprises:

in a first operating mode, connecting a bit line of a column where the delay buffer unit is located with a first operating voltage terminal, and connecting a source line of a row where the delay buffer unit is located with a second operating voltage terminal, and performing a first processing operation on a memristor in the delay buffer unit according to a first control signal corresponding to the delay buffer unit;

in the second operating mode, connecting the bit line of the column where the delay buffer unit is located and a source line of a row where the delay buffer unit is located with the first operating voltage terminal, and performing a computing operation or a calibration read operation on the at least one delay processing combination according to the control signal combination.

18. The operating method according to claim 17, wherein performing a computing operation on at least one delay processing combination as selected according to the control signal combination, comprises:

applying 2N first control signals as computing input signals to 2N delay buffer units in the at least one delay processing combination through the 2N word lines;

obtaining a differential delay computing result from an output terminal of the at least one delay processing combination.

19. The operating method according to claim 17, wherein performing a calibration read operation on at least one delay processing combination selected according to the control signal combination, comprises:

determining a target column in the at least one delay processing combination for performing the calibration read operation;

applying a first control signal for accessing the memristor and a first control signal for bypassing the memristor respectively to two delay buffer units in the target column in the at least one delay processing combination;

applying a first control signal for bypassing the memristor to a plurality of columns other than the target column in the at least one delay processing combination; and obtaining a differential delay read result at the output terminal of the at least one delay processing combination.

20. The operating method according to claim 19, further comprising:

determining whether to perform the first processing operation on at least one memristor in the two delay buffer units on the target column according to the differential delay read result;

in the case where the differential delay reading result does not reach an expected weight value, performing the first processing operation again on the at least one memristor.

\* \* \* \* \*